(12) United States Patent
Strachan et al.

(10) Patent No.: US 9,225,441 B2
(45) Date of Patent: Dec. 29, 2015

(54) SYSTEM AND APPARATUS FOR LOCATING FAULTS IN A CABLE NETWORK

(75) Inventors: Frank Strachan, Pullenvale (AU); Brendan Horsfield, Rochedale South (AU); Greg Delforce, Bulimba (AU); Ian Davies, Cedar Grove (AU)

(73) Assignee: Kaelus Pty Ltd, Queensland (AU)

( * ) Notice: Subject to any disclaimer, the term of this patent is extended or adjusted under 35 U.S.C. 154(b) by 0 days.

(21) Appl. No.: 14/006,603

(22) PCT Filed: Mar. 21, 2012

(86) PCT No.: PCT/AU2012/000294
§ 371 (c)(1),
(2), (4) Date: Feb. 10, 2014

(87) PCT Pub. No.: WO2012/126056
PCT Pub. Date: Sep. 27, 2012

(65) Prior Publication Data
US 2014/0146866 A1    May 29, 2014

(30) Foreign Application Priority Data
Mar. 21, 2011   (AU) ................................ 2011901026

(51) Int. Cl.
*H04B 17/00*   (2015.01)
*G01R 31/08*   (2006.01)
*H04B 17/309*  (2015.01)

(52) U.S. Cl.
CPC .......... *H04B 17/0042* (2013.01); *G01R 31/086* (2013.01); *H04B 17/309* (2015.01)

(58) Field of Classification Search
CPC ...... H04B 17/101; H04B 17/23; H04B 17/26; H04B 17/27
USPC ........... 455/67.11, 67.14, 67.16, 67.7, 68, 69; 702/57, 66, 67, 75, 76, 108, 120, 121, 702/122, 124, 126; 324/555, 614
See application file for complete search history.

(56) References Cited

U.S. PATENT DOCUMENTS

| | | | |
|---|---|---|---|
| 7,696,850 B2 | 4/2010 | Stanford et al. | |
| 8,058,880 B2 | 11/2011 | Bradley et al. | |
| 8,593,158 B1 | 11/2013 | Bradley et al. | |
| 2009/0125253 A1* | 5/2009 | Blair et al. | 702/57 |
| 2010/0085061 A1* | 4/2010 | Bradley et al. | 324/520 |
| 2010/0164504 A1 | 7/2010 | Bradley | |
| 2011/0224923 A1 | 9/2011 | Blair et al. | |
| 2011/0304457 A1* | 12/2011 | Bausov et al. | 340/552 |

OTHER PUBLICATIONS

International Search Report from the Australian Patent Office for International Application No. PCT/AU2012/000294, mailed Apr. 26, 2012.

(Continued)

*Primary Examiner* — Ping Hsieh
(74) *Attorney, Agent, or Firm* — Snell & Wilmer LLP

(57) ABSTRACT

A range to fault (RTF) module (100) for use in a system for locating faults in a cable network is discussed. The module includes an input port (101) for coupling the module to a PIM analyzer. The module (100) also includes an output port (102) for connection to the device under test (DUT). In addition to the input (101) and output (102) ports the module is provided with a monitor port (103) for receipt of a PIM signal from the PIM analyzer. The module in this instance also includes two USB ports (104*a*), (104*b*) enabling a serial connection between the PIM analyzer and the module (100).

39 Claims, 12 Drawing Sheets

(56) References Cited

OTHER PUBLICATIONS

Written Opinion of the International Searching Authority for International Application No. PCT/AU2012/000294, mailed Apr. 26, 2012.

Communication from the European Patent Office for corresponding European Patent Appl. No. 12761056.6, dated Sep. 29, 2014 (8 pages total).

* cited by examiner

SYSTEM AND APPARATUS FOR LOCATING FAULTS IN A CABLE NETWORK

BACKGROUND OF THE INVENTION

1. Field of the Invention

The present invention relates to a device for the detection of faults in a communications network. In particular although not exclusively the present invention relates to a device for the location of passive intermodulation faults in a coaxial cable network.

2. Discussion of the Background Art

Passive intermodulation distortion (PIM) is a form of electromagnetic interference that is often encountered in radio communications systems such as cellular mobile telephone networks. It can arise wherever there are devices or components with nonlinear transfer characteristics. Examples include oxidised metal-on-metal junctions, components containing ferrites (such as RF circulators), components with sharp metallic edges, loose connectors, and a myriad of other imperfections such as defective plating, dirt and other forms of contamination.

PIM is especially prevalent in full-duplex systems, where the transmitted and received radio signals are diplexed onto the same feeder cable. In such environments, the high-power transmit signals generate PIM as they pass through defective components, after which the PIM signals then propagate in two directions:

Towards the antenna in the same direction as the transmit signals (so-called "forward PIM" or "through PIM"); and Back towards the base station ("reflected PIM")

Of the two cases, reflected PIM is usually the greater concern. This is because in many situations the frequency of the PIM signal falls within the passband of the base station's receiver, resulting in loss of sensitivity and an increased dropped call rate.

PIM faults in cell sites can be difficult and time-consuming to diagnose and repair. This is because the interconnection between BTS and antenna can consist of multiple components, including feeder cables, diplexers, filters, combiners, jumper cables, masthead amplifiers and bias tees. Furthermore, the radio transceiver and antenna are themselves potential sources of PIM.

The conventional approach to measuring PIM is the so-called two-tone test. This is an industry-standard test that entails applying a pair of high-power carriers (typically +43 dBm each) of different frequencies to the input of the cable network, and measuring the reflected PIM product(s) that land in the cell site's receive band. In theory the two-tone test creates PIM products at an infinite number of discrete frequencies. However, in many (but by no means all) cell sites the only PIM products of interest are the odd-ordered products below the carrier frequencies $F_1$ and $F_2$, as it is these products that are usually responsible for the majority of PIM problems encountered in practice. A simple equation for calculating the frequencies of these products is as follows:

$$F_{IMx} = F_1 - m(F_2 - F_1)\ m=1,2,3\ldots$$

where $F_{IMx}$=frequency of $x^{th}$ order PIM product located below $F_1$ and $F_2$ x=2 m+1

$F_1$, $F_2$=frequencies of high-power carriers

It must be emphasised that other PIM products the besides the odd-ordered products below carrier frequencies $F_1$ and $F_2$ are capable of causing problems in a cell site, depending on the particular spectrum allocation used in the network. For example, some cellular networks are vulnerable to the odd-ordered PIM products located above the transmit band rather than below it.

Similarly, even-ordered PIM products can be problematic in some situations. For example cell sites with co-sited GSM900 and PCS systems can potentially be affected by second-order PIM products from the 900 MHz transmitter landing in the PCS receive band.

For the sake of clarity of explanation, the following discussion will focus on a test apparatus that has been designed to measure odd-ordered PIM products below carrier frequencies $F_1$ and $F_2$. However, it shall be understood that the same technique can be used with any measurable PIM product of either odd or even order, at frequencies either above or below the high-power carrier frequencies.

At present the only commercially available instrument for troubleshooting PIM faults in cell sites is the scalar PIM analyser. This is simply a portable two-tone test instrument containing all of the necessary hardware in one box, including frequency synthesisers, high-power amplifiers, triplexer, low-noise receiver and a results display. Two such scalar PIM analysers are discussed in the Applicants co-pending U.S. application Ser. No. 11/936,968 and U.S. Ser. No. 11/941,712 entitled Passive Intermodulation Test Apparatus the disclosures of which are herein incorporated by reference.

Unfortunately, scalar PIM analysers as discussed in the applicant's earlier applications are only capable of measuring the overall PIM level in a cable network. They do not provide any information about the locations of individual PIM faults. With a scalar PIM analyser there are only two ways of isolating PIM faults:

Percussive testing: This involves tapping every component and cable joint in the network with a small rubberised mallet or screwdriver handle, while continuously monitoring the PIM level. Defective components will usually (but not always) cause the PIM level to fluctuate wildly when perturbed in this manner; or Progressive assembly/disassembly of cable network, with PIM testing being performed on the partially assembled network at every stage.

Both of the above approaches are less than optimal. The first method is usually a two-person job, and may require one of the testing personnel to climb the antenna mast in order to locate the source of the PIM fault. Similarly, the second method is potentially very labour-intensive and time-consuming, especially in crowded cell sites with large bundles of feeder cables strapped together on the same mast.

Clearly it would be advantageous to provide a system and method for the detection of the location and magnitude of sources of PIM in a communications network with a high degree of reliability and accuracy.

SUMMARY OF THE INVENTION

Disclosure of the Invention

Accordingly in one aspect of the present invention there is provided a test module for use in a system for locating faults said test module including:

an input port for receiving one or more test signals;

an output port for applying said one or more test signals to a test medium;

a monitor port for reception of a plurality of passive intermodulation signals produced by the test medium in response to the test signals;

a directional coupler module coupled between the input and output ports;

a primary receiver coupled to the monitor port and directional coupler module for reception of a plurality of primary return signals produced by the test medium in response to the one or more test signals;

a reference receiver coupled to the directional coupler module for generating a plurality of reference signals from the one or more test signals;

a phase detector module coupled to the primary and reference receivers said phase detector measuring phase offsets between the plurality of primary return signals and reference signals;

a control module coupled to the primary and reference receivers and the phase detector said control module being adapted to:
  convert each signal within the plurality of primary return signals from the primary receiver to a set primary power levels;
  convert each signal within the plurality of reference signals from reference receiver to a set reference power levels;
  convert each signal within the plurality of signals from the phase detector to a set of phase offsets in degrees; and
  store the converted power level for the primary return and reference signal levels and the converted set of phase offsets between the primary return and reference signals for further processing.

In yet another aspect of the present invention there is provided a system for locating faults said system including;

a test module said test module having:
  an input port for receiving one or more test signals;
  an output port for applying said one or more test signals to a test medium;
  a monitor port for reception of a plurality of passive intermodulation signals produced by the test medium in response to the test signals;
  a directional coupler module coupled between the input and output ports;
  a primary receiver coupled to the monitor port and directional coupler module for reception of a plurality of primary return signals produced by the test medium in response to the one or more test signals;
  a reference receiver coupled to the directional coupler module for generating a plurality of reference signals from the one or more test signals;
  a phase detector module coupled to the primary and reference receivers said phase detector measuring phase offset between corresponding pairs of primary and reference return signals for each pair of signals within the plurality of primary return signals and the plurality of reference return signals to produce a set of phase offsets;
  a control module coupled to the primary and reference receivers and the phase detector said control module being adapted to:
    convert each signal within the plurality of primary return signals from the primary receiver to a set primary power levels;
    convert each signal within the plurality of reference signals from reference receiver to a set reference power levels;
    convert each signal within the plurality of signals from the phase detector to a set of phase offsets in degrees; and
    store the converted power level for the primary return and reference signal levels and the converted set of phase offsets between the primary and reference signals for further processing;
  a test unit coupled to the input port of the test module said test unit providing said one or more test signals and wherein the test unit is adapted to:
    receive from the control module the converted power level for the primary return and reference signal levels and the converted set of phase offsets between the primary return and reference signals and combine them into a single vector;
    estimate from the single vector the number of passive intermodulation sources within the test medium;
    determine for each passive intermodulation source its magnitude and location within the test medium; and
    display the magnitude and location of each passive intermodulation source within the test medium.

Suitably the directional coupler contains a forward coupler and two reverse couplers. The forward coupler preferably has a coupling loss of approximately 37 dB, while the reverse couplers preferably have a coupling loss of approximately 30 dB. The directivity of all three couplers is tuned to at least 20 dB across both the Tx and Rx test bands.

The input port of the test module is preferably a 7-16 male coaxial connector. The output port of the test module is preferably a 7-16 female coaxial connector. The monitor port is preferably a Type-N female coaxial connector. The USB connector is preferably a USB 2.0 Mini-B receptacle.

Preferably the phase detector module includes a phase-frequency detector IC from ON Semiconductor, followed by an active low-pass difference filter.

The test module may include a synthesiser module coupled to the coupler module. Suitably the synthesiser module includes a VSWR source, a first frequency synthesiser and second frequency synthesiser. The VSWR source is preferably a wideband PLL synthesiser which can be tuned to any frequency in Tx and Rx test bands, in increments of 5 kHz. The VSWR synthesiser may also operate at frequencies far outside these bands. The output power level of the VSWR source may programmable to a number of discrete levels for example −4 dBm, −1 dBm, +2 dBm and +5 dBm. The output of the VSWR source may be connected to an RF amplifier module, which is capable of boosting the signal level from the VSWR source to approximately +15 dBm.

Suitably the reference receiver module includes a narrowband heterodyne receiver with a network of solid state switches and SAW filters at its front end. The reference receiver module may also include a first downconverter, a bandpass filter and a second downconverter.

The primary receiver preferably includes a narrowband heterodyne receiver with a pair of RF switches at its front end. Suitably the primary receiver includes a two-stage downconverter, with amplification and filtering in both the first and second IF stages. The second IF bandwidth of the receiver is 4 kHz. The nominal noise floor is better than −130 dBm.

When operating in Range-to-PIM mode, the primary receiver can be tuned to detect PIM products of any order. This includes not only IM3, but also any higher-order PIM products that happen to fall in the receive band, such as IM5, IM7, IM9 etc, provided of course that these signals are above the noise floor of the system. This enables the apparatus to pinpoint PIM faults and cross-check results using a variety of PIM products, or even combinations of products of different orders.

The test signals applied to the test medium are in one or more of the following communications frequencies 450-460 MHz, 470-500 MHz, 800-830 MHz, 850-870 MHz, 820-850 MHz, 860-900 MHz, 875-880 MHz, 870-900 MHz, 890-910

MHz, 920-925 MHz, 930-940 MHz, 930-960 MHz, 1850-1910 MHz, 1930-1990 MHz, 1430-1440 MHz, 1710-1755 MHz, 2110-2155 MHz, 2110-2170 MHz, 2500-2690 MHz, such as in the 450, 700, 800, 850, 900, 950, 1700, 1800, 1900, 2100, 2500, 450-460 MHz, 470-500 MHz, 800-960 MHz, 1710-2025 MHz, 2110-2200 MHz and 2500-2690 MHz communications bands. The test signal's frequency may be swept incrementally by stepping the frequency of one of the test signals within the chosen communications band while the frequency of the remaining band remains fixed. Preferably the stepping is in increments of 0.25 MHz.

The test module may include a reflectometer for the measurement of vector reflection coefficient.

Preferably the amplitude and phase measurements are combined into a single vector of complex values, one per frequency point. Suitably the estimation of the number of passive intermodulation sources includes constructing a system of linear prediction equations based on the vector to produce a linear prediction data matrix, and performing a singular value decomposition on the linear prediction data matrix to produce a set of singular values. The set of singular values is analysed to identify the points in the set for which a 6 dB decrease in magnitude occurs from one singular value to the next. All singular values that are located after the last such transition are then set to zero to produce a set of modified singular values.

The calculation of the location and magnitude of each passive intermodulation source may include reconstituting a modified linear prediction data matrix using the set of modified singular values; determining the coefficients of the characteristic polynomial for the modified linear prediction data matrix utilising the Total Least Squares method; calculating the roots of the characteristic polynomial using said coefficients; calculating the location of each passive intermodulation source from said roots; and calculating the magnitude of each passive intermodulation source based on said coefficients and roots utilising the Least Squares Prony method.

The test medium may be a coaxial cable network, cellular mobile telephone base station, remote radio head or the like.

BRIEF DETAILS OF THE DRAWINGS

In order that this invention may be more readily understood and put into practical effect, reference will now be made to the accompanying drawings, which illustrate preferred embodiments of the invention, and wherein.

DESCRIPTION OF EMBODIMENTS OF THE INVENTION

Figure 1:
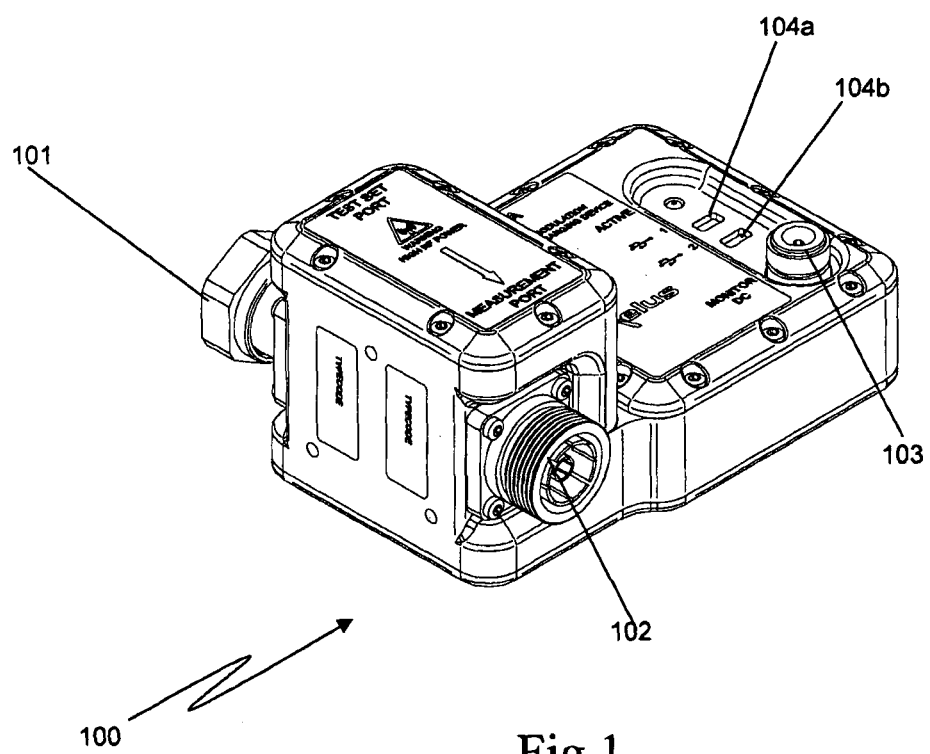
FIG. 1 is a mechanical drawing depicting one possible configuration of a range to fault module according to one embodiment of the present invention.

With reference to FIG. 1 there is illustrated one possible arrangement of a range to fault (RTF) module 100 for use in a system for locating faults in a cable network. As shown the module includes an input port 101 for coupling the module to a PIM analyser. The PIM analyser in this case is generally of the type disclosed in the applicant's co-pending U.S. application Ser. No. 11/936,968 and U.S. Ser. No. 11/941,712 entitled Passive Intermodulation Test Apparatus the disclosure of which are herein incorporated by reference, with a number of modifications which are discussed in greater detail below.

The module 100 also includes an output port 102 for connection to the device under test (DUT). In most cases the DUT will be a co-axial cable network of the type found in cellular mobile telephone base stations. These cable networks usually consist of several devices connected together in cascade, including low-loss feeder cables, diplexers, filters, combiners, jumper cables, masthead amplifiers and bias tees. Any one of these components may be a source of PIM. The cable network is terminated in one or more antennas installed in an elevated location like a mast or rooftop. As with every other component in the system, the antennas are also potential sources of PIM. Of course it will be appreciated by those of skill in the art that the application of the RTF module of the present invention could be utilised to locate PIM faults in other forms of cable networks and is not strictly limited in its application to the detection of PIM faults within a co-axial cable network.

In addition to the input 101 and output 102 ports the module is provided with a monitor port 103 for receipt of a PIM signal from the PIM analyser. The module in this instance also includes two USB ports 104a, 104b enabling a serial connection between the PIM analyser and the module 100.

Figure 2:
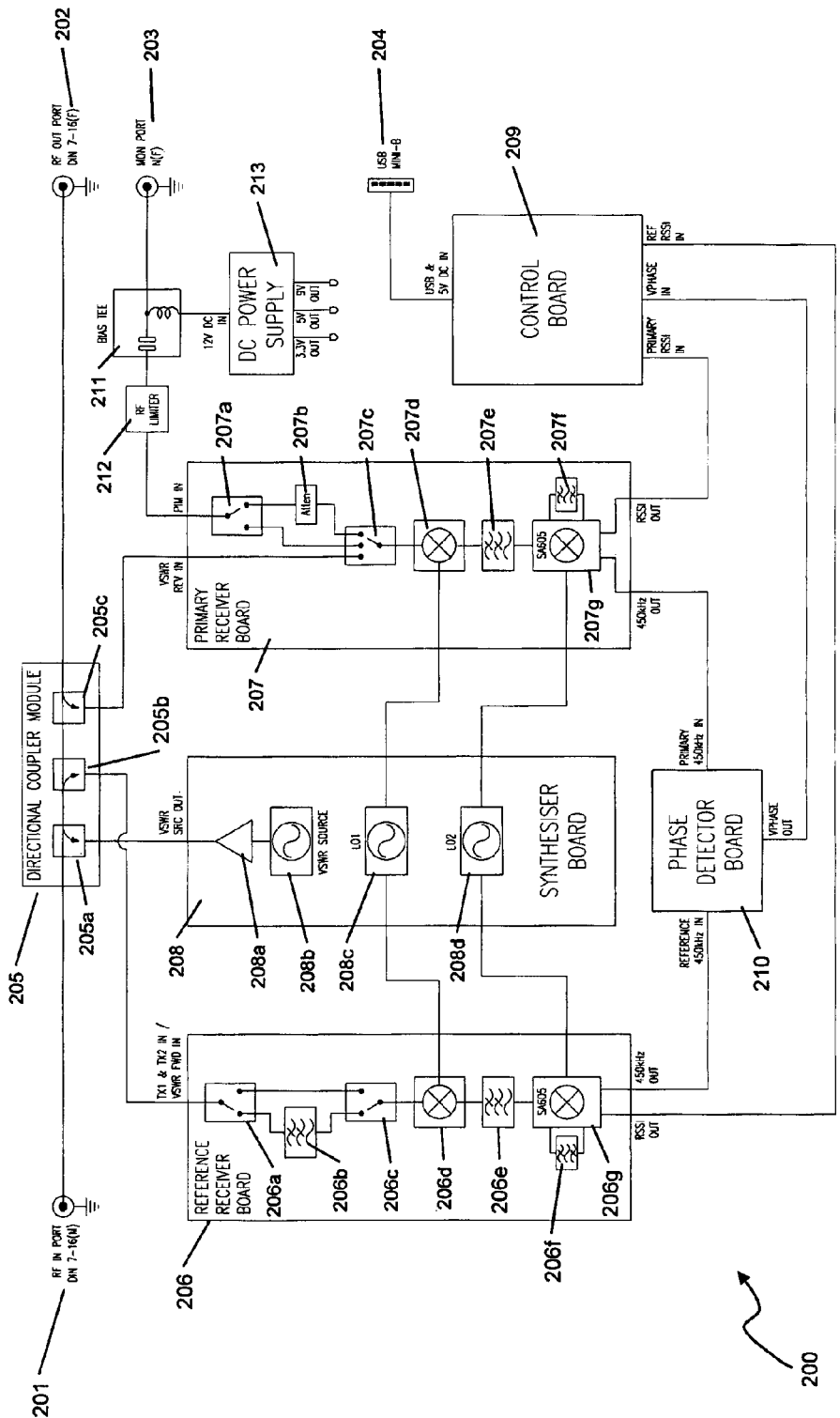
FIG. 2 is a circuit diagram depicting one arrangement of range to fault module according to one embodiment of the present invention.

FIG. 2 is a circuit diagram for the construction of an RTF module according to one embodiment of the present invention. As shown a number of electronic modules are coupled between the input port 101, output port 102, monitor port 103 and USB ports 104a, 104b. Namely a directional coupler module 205, Reference Receiver module 206, Primary Receiver module 207, Synthesiser module 208, Control module 209 Phase Detector 210, Bias Tee 211, RF Limiter 212 and DC Power Supply 213.

The directional coupler module 205 contains a forward coupler 205b and two reverse couplers 205a, 205c. The forward coupler 205b in this example has a coupling loss of approximately 37 dB, while the reverse couplers have a coupling loss of approximately 30 dB. The directivity of all three couplers is tuned to at least 20 dB across both the Tx and Rx bands of the PIM analyser. As shown the first reverse coupler 205a is coupled to a VSWR synthesiser housed within the synthesiser module 208. The VSWR synthesiser in this case includes a VSWR source 208b and amplifier 208a. The first reverse coupler 205a in this instance acts to inject a VSWR stimulus signal onto the output port 102 when the RTF module is in Range-To-VSWR mode.

The forward coupler 205b in this case is coupled to the front end of the reference receiver module 206 which is discussed in greater detail below. This forward coupler 205b coupler in this example serves a dual purpose, depending on which mode the instrument is operating in. In Range-To-PIM mode, the forward coupler 205b samples the two high power carriers from the PIM analyser to enable the module to generate a reference PIM signal. In Range-To-VSWR mode, the forward coupler samples the forward-travelling VSWR stimulus signal to enable the apparatus to measure the vector reflection coefficient.

The output from the second reverse coupler 205c is connected to the VSWR Reverse port of the primary receiver module 207. When the RTF module 100 is operating in VSWR mode, the second reverse coupler samples the reflected signal from the DUT.

It will of course be appreciated by those of skill in the art that great care must taken during the manufacture of the directional coupler module 205 to ensure that its residual PIM level is very low (−120 dBm max). This is critical in minimising the baseline PIM level of the apparatus, thereby maximising the sensitivity of the instrument as a whole.

As shown the synthesiser module 208 contains three signal sources: the VSWR source 208b mentioned above, a first frequency synthesiser 208c and a second frequency synthesiser 208d. The VSWR source 208b in this example is a wideband PLL synthesiser. It can be tuned to any frequency in PIM analyser's Tx and Rx bands, in increments of 5 kHz. It is also capable of operating at frequencies far outside these bands, although this not often likely to be necessary in the intended application. The output power level of the VSWR source is programmable to four levels: −4 dBm, −1 dBm, +2 dBm and +5 dBm. Under normal operating conditions the level is set to +5 dBm. The output of the VSWR source is connected to an RF amplifier module 208a, which boosts the signal level to approximately +15 dBm. The output of the RF amplifier is connected to the coupled port of the first reverse coupler 205a, which injects the signal onto the main RF path, in the direction of the RF OUT port 202 of the apparatus.

The frequency synthesiser 208c is a wideband PLL synthesiser of the same type as the VSWR source synthesiser. It provides the local oscillator signal for the first downconverter stage in the primary 206 and reference receiver 207 modules. This ensures that the first IF signals in the two receivers are phased locked to each other.

The frequency synthesiser 208d is a 70 MHz fixed-frequency crystal oscillator. It provides the local oscillator signal for the second downconverter stage in the primary 206 and reference receiver 207 modules. This ensures that the second IF signals in the two receivers are phase locked to each other.

It will be appreciated by those of skill in the art that it is not necessary for any of the frequency sources in the RTF module to share a common 10 MHz reference with each other, or indeed with the two Tx synthesisers inside the PIM analyser. It is sufficient for the primary and reference receivers to share common feeds from the frequency synthesisers 208c, 208d.

In this example the primary receiver module 207 includes a narrowband heterodyne receiver with a pair of RF switches 207a, 207c at its front end. These switches can be toggled between two RF input ports, depending on whether the instrument is operating in Range-to-PIM mode or Range-to-VSWR mode. They also allow a 40 dB fixed attenuator 207b to be switched into the RF path if the amplitude of the incoming PIM signal exceeds a certain level. When the apparatus is in Range-to-PIM mode, the switches 207a, 207c are set to the PIM input port, with the attenuator 207b in circuit if necessary. This configuration enables the primary receiver to detect the incoming PIM signal from the monitor port 110, 203 of the RTF module. When the apparatus is in Range-to-VSWR mode, the input switch 207c is set to the VSWR REV input port. This enables the primary receiver to detect the output from reverse coupler 205c.

The architecture of the primary receiver in this case includes a two-stage downconverter, with amplification and filtering in both the first and second IF stages. The first and second local oscillator signals are obtained from the first frequency synthesiser 208c and second frequency synthesiser 208d. The second IF bandwidth of the receiver is 4 kHz. The nominal noise floor is better than −130 dBm. When operating in Range-to-PIM mode, the primary receiver can be tuned to detect PIM products of any order. This includes not only IM3, but also any higher-order PIM products that happen to fall in the receive band, such as IM5, IM7, IM9 etc, provided of course that these signals are above the noise floor of the system. This enables the apparatus to pinpoint PIM faults and cross-check results using a variety of PIM products, or even combinations of products of different orders.

The primary receiver produces two outputs: an RSSI signal which is a DC voltage that is proportional to the power (in dBm) in the PIM or VSWR REV signal, and a 450 kHz square wave which is simply a clipped version of the downconverted PIM or VSWR signal. The 450 kHz square wave is produced by the limiting amplifier in the second IF stage of the receiver, and contains all of the phase information in the unclipped signal, but with the amplitude content removed.

The RSSI signal is digitised in the control module 209 of the RTF module 100, and converted into a power level in dBm using a set of calibration constants stored in the control module's EEPROM. The resulting value is reported to the PIM analyser via the USB link 510. The 450 kHz square wave is used to measure the phase of the PIM or VSWR REV signal. This is achieved in the phase detector module 210, which is discussed in more detail below.

The reference receiver module 206 in this instance includes a narrowband heterodyne receiver with a network of solid state switches 206a, 206c and SAW filters 206b at its front end which is coupled to the forward coupler 205b. The reference receiver module 206 performs two distinct functions, depending on whether the instrument is operating in Range-to-PIM mode or Range-to-VSWR mode. When the apparatus is in Range-to-PIM mode, the main function of the reference receiver module is to generate a reference PIM signal against which the phase of the measured PIM signal can be compared.

The first step in this process is to switch a Tx-band SAW filter 206b into the RF path at the input to the reference receiver module. This SAW filter allows the sampled $Tx_1$ & $Tx_2$ carriers from the PIM Analyser to pass through to the downconverter chain, while preventing any PIM signals generated in downstream circuit elements from propagating back into the PIM analyser's test port via the forward coupler 205b. In some cases a single SAW filter may not provide sufficient rejection for this purpose, in such cases two or more SAW filters may be connected in cascade to achieve the desired performance.

The sampled $Tx_1$ & $Tx_2$ carriers then enter the first downconverter stage 206d. In the present example the first downconverter is a Renesas uPC2758TB active mixer which is deliberately operated near its compression region. This has the effect of creating a set of intermodulation products which can be used as reference tones. As an added benefit, the uPC2758TB device also downconverts these intermodulation products to the first IF band. This approach avoids the need to have a separate reference tone generator circuit. The output of the first downconverter is then bandpass filtered 206e to remove the residual Tx carriers and unwanted intermodulation products. The remaining signal then enters the second downconverter stage 206g, 206f where it is mixed down to 450 kHz, thus completing the reference PIM generation process.

The fact that both the primary and reference PIM signals are derived from the same pair of high-power carriers confers several performance advantages on the system as a whole. Firstly, the reference PIM signals generated in the uPC2758TB are phase-locked to the primary PIM signals generated in the DUT. This is essential in any coherent ranging system.

Secondly, any changes in the absolute phases of the two high-power carriers are tracked equally by both the primary and reference PIM signals. This is particularly important as the HPA module in the PIM analyser heats up during extended periods of operation, thereby causing its phase response to change over time. By using the same pair of carriers to generate both the primary and reference PIM signals, any change in the phase response of the HPA is automatically cancelled out. An added benefit is that the phase detection algorithm used by the RTF module does not need to be temperature compensated.

In Range-to-VSWR mode, the reference receiver module 206 switches the Tx-band SAW filter 206b out of the RF path, so that the sampled VSWR stimulus signal can pass directly to the downconverter chain. This allows Range-to-VSWR measurements to be made in both the Tx and Rx bands of the PIM analyser. In principle it is also possible to make Range-to-VSWR measurements outside of the Tx & Rx bands of the PIM analyser, provided the return loss of the device under test is better than approximately 3 dB. Alternatively, the RTF module can be detached from the test port of the PIM analyser, and a 50 ohm load attached to its input port 101. This would enable the apparatus to make highly accurate wideband Range-to-VSWR measurements, independent of the return loss of the DUT.

Regardless of which mode the instrument is operating in, the reference receiver produces two outputs: an RSSI signal which is a DC voltage that is proportional to the power (in dBm) in the PIM or VSWR FWD signal and a 450 kHz square wave which is simply a clipped version of the downconverted PIM or VSWR signal. It is produced by the limiting amplifier in the second IF stage of the receiver, and contains all of the phase information in the unclipped signal, but with the amplitude content removed.

The RSSI signal is digitised in the control module 209 of the RTF module, and converted into a power level in dBm using a set of calibration constants stored in the control module's EEPROM. The resulting value is reported to the PIM analyser via the USB link 510. The 450 kHz square wave serves as a phase reference against which the phase of the PIM or VSWR FWD signal is measured. This is achieved in the phase detector module 210.

As illustrated the 450 kHz square wave outputs from the primary and reference receiver modules 207, 206 are provided to the phase detector module 210. In the present example the phase detector module 210 comprises an MCK12140 phase-frequency detector IC from ON Semiconductor, followed by an active low-pass difference filter. The output of this circuit is a DC voltage Vphase proportional to the phase offset between the primary and reference square waves. This circuit is a four-quadrant detector, meaning it is capable of measuring phase offsets from −180° to +180° without ambiguity.

The output voltage $V_{phase}$ from the phase detector module 210 is digitised by the microcontroller in the control module 209 and converted into a phase offset in degrees using a set of calibration constants stored in the control module's EEPROM. The resulting value is reported to the PIM analyser via the USB link 510.

In an alternative embodiment the above phase detector could be replaced by a digital phase detector, as set out in the applicant's earlier filed Australian provisional application AU 2010903266 entitled "Method and Apparatus for Locating Faults in Communications Networks" which is herein incorporated by reference.

The control module 209 in this case coordinates the functions of the various modules within the RTF module. It also manages the communication link with the PIM analyser to ensure that measurements are performed in a synchronous manner. The control module consists principally of a PIC24HJ256GP206A microcontroller manufactured by Microchip. The microcontroller contains 256 kB of on-board EEPROM in which the RTF module's factory calibration data can be stored. This avoids the need for the unit to be shipped with a separate setup disc containing calibration data unique to that unit.

The microcontroller performs the following functions
Turns bias voltages of devices in the RTF module on and off as necessary.
Programs PLLs in synthesiser module 208.
Sets the state of the RF switches 206a, 206c, 207a, 207c in RTF module according to the instrument's operating mode (i.e. Range-to-PIM or Range-to-VSWR).
Digitises output voltages from primary receiver 207, reference receiver 206 and phase detector module 210.
Converts measured outputs from primary & reference receivers to power levels in dBm using calibration constants stored in EEPROM.
Converts measured output from phase detector module 210 to a phase offset in degrees using calibration constants stored in EEPROM.
Reports measured power levels and phase offsets from the RTF module to the PIM analyser.

Communications with the PIM analyser are achieved using an FT232RL USB-to-Serial interface module manufactured by FTDI. One side of this IC is connected to the UART of the microcontroller, while the other is connected to the USB 2.0 Mini-B connector 204 on the exterior of the RTF module. The FT232RL also provides access to the 5V supply from the PIM analyser's USB port. This 5V rail is used to power the microcontroller. The rest of the RTF module draws its power from the PIM analyser's monitor port 502.

When the RTF module 100 is first connected to the PIM analyser, the microcontroller executes a handshaking and device authentication procedure with the PIM analyser. During this phase the 12V supply on the PIM analyser's monitor port is disabled. When the communications link to the PIM analyser has been established, the PIM analyser enables the 12V supply. The microcontroller in the RTF module then turns on the bias voltages from the DC power supply according to the desired operating mode.

The bias tee 211 is an internal module that follows immediately after the monitor port connector 103. The bias tee in this case extracts a 12V DC supply voltage from the centre pin of the monitor port which is provided to the DC power supply 213. The DC power supply contains a bank of voltage regulators and power supply filters which convert the 12V supply into a set of smaller voltages for the various modules in RTF module. The RF limiter 212 is a protective device fitted between the RTF module's internal bias tee 211 and the PIM input port on the primary receiver module 207. The purpose of the RF limiter is to protect the primary receiver module 207 from damage in the event that a strong RF signal source is accidentally connected to the RTF module's monitor port.

Figure 3:
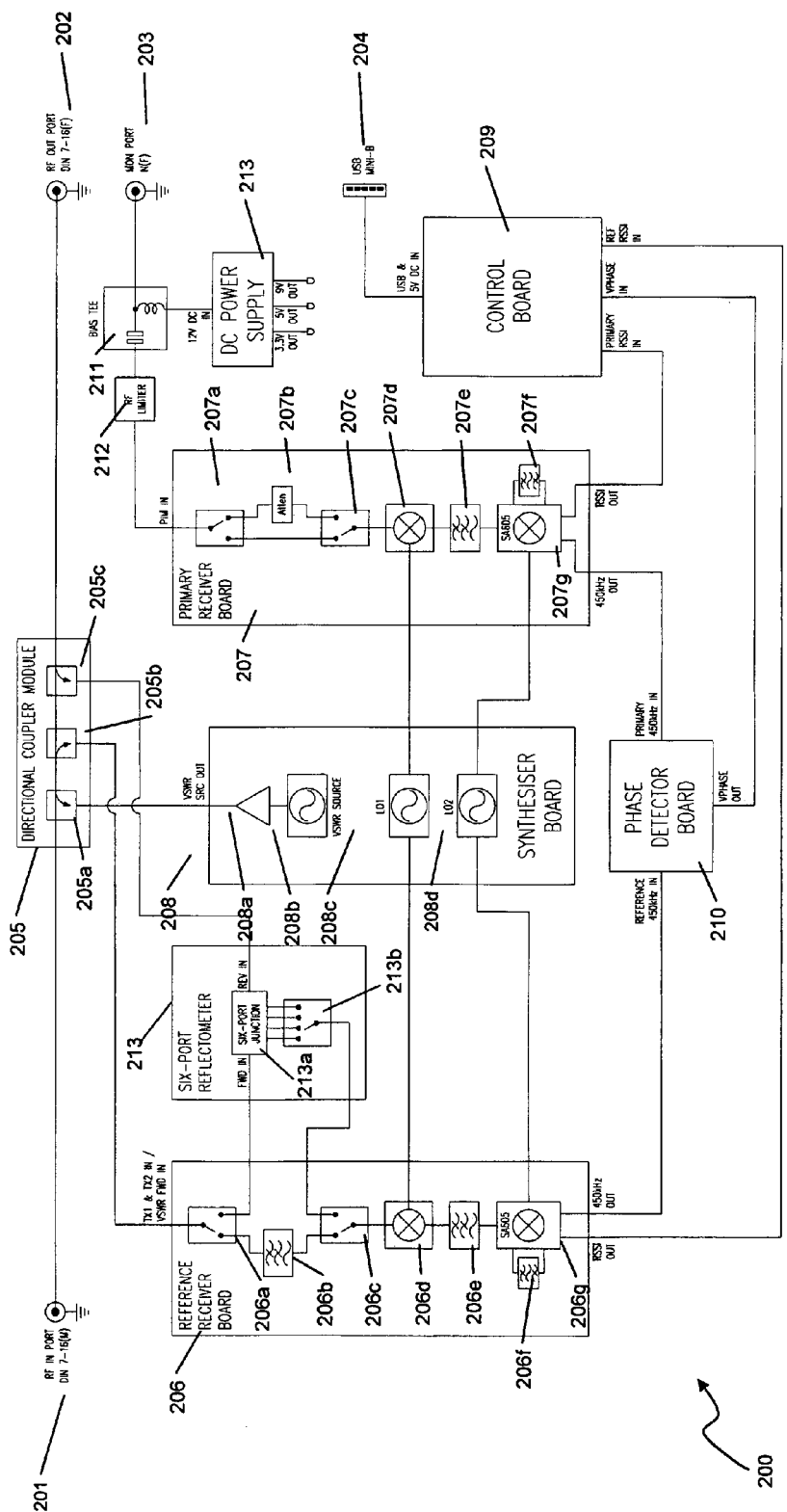
FIG. 3 is a circuit diagram depicting an alternate arrangement of range to fault module according to one embodiment of the present invention.

FIG. 3 depicts an alternate arrangement of the RTF module 100. As shown the RTF module in this case is of a similar construction to that of module discussed in relation to FIG. 2 above. Namely the RTF module includes a directional coupler module 205, Reference Receiver module 206, Primary Receiver module 207, Synthesiser module 208, Control module 209 Phase Detector 210, Bias Tee 211, RF Limiter 212 and DC Power Supply 213. The interconnections between the Reference Receiver module 206, Primary Receiver module 207, Synthesiser module 208, Control module 209 Phase Detector 210, Bias Tee 211, RF Limiter 212 and DC Power Supply 213 remain substantially the same as that described in relation to FIG. 2 above. The main point of distinction between the architecture of the RTF module of FIGS. 2 and 3 is the inclusion of a six port reflectometer 213 coupled between the directional coupler module 205 and the reference receiver module 206.

As shown the reflectometer 213 has two RF input ports designated "FWD IN" and "REV IN". The FWD IN port is connected to the output from the forward directional coupler 205b via the RF switching network 206a at the input to the reference receiver 206. The REV IN port is connected to the output from the reverse directional coupler 205c.

The signals at the FWD IN and REV IN ports are applied to the six-port junction 213a, which produces four distinct linear combinations of the two input signals. These four output signals are connected to the input of the downconverter in the reference receiver 206 via a single-pole 4-throw RF switch 213b and single-pole double-throw RF switch 206c. The RSSI voltages corresponding to the amplitudes of the four output signals are digitised in turn in the control module 209 of the RTF module, and converted into power levels in dBm using a set of calibration constants stored in the control module's EEPROM. The resulting power levels are reported back to the PIM analyser via the USB link, where they are converted into a vector reflection coefficient using a set of six-port calibration constants stored on the PIM analyser's hard drive.

It will of course be appreciated by those of skill in the art that when the six-port reflectometer is in use, the primary receiver 207 is not required. It would therefore be possible to power down the active components in the primary receiver in order to reduce the power consumption of the RTF module.

Both the arrangements of FIGS. 2 and 3 utilise a USB connection to the PIM analyser as well as an onboard DC module which draws a 12V feed from the monitor port of the PIM analyser. It will of course be appreciated by those of skill in the art that the USB connection between the PIM analyser and the RTF module 100 could be eliminated by running communications over the monitor connection. This could be achieved by connecting the spare RS-232 port on the PIM analyser's touch-screen PC to a modem that modulates the digital data stream onto a 2.176 MHz carrier, similar to an AISG communications link. The modulated waveform would be injected onto the PIM analyser's monitor port. A similar modem would also be required inside the RTF module. It would be connected to the DC port of the RTF module's bias tee 211. The data stream to/from the modem would be connected to the UART of the microcontroller on the control module 209.

In yet another embodiment the RTF module 114 could be powered entirely by the two USB ports on the PIM analyser's front panel. This would eliminate the need for the bias tee 211 to be fitted to the RTF module. However this form of interconnection between the PIM analyser and the RTF module is less than ideal as it requires both of the PIM analyser's USB ports to be connected to the RTF module while it is in use. This is due to the fact that a single USB port cannot source enough power to drive the RTF module. As a result the user could not connect a mouse, memory stick or file transfer cable to the PIM analyser while the RTF module was in use.

Figure 4:
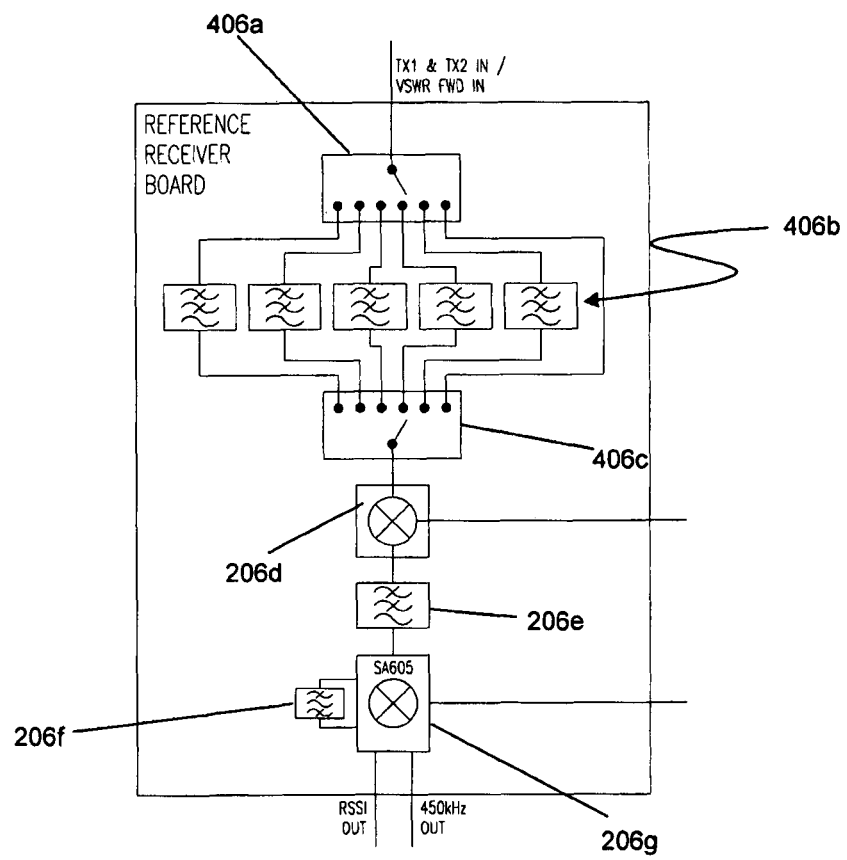
FIG. 4 is a circuit diagram depicting one possible arrangement of a reference receiver module for use in the range to fault module according to one embodiment of the present invention.
Figure 5:
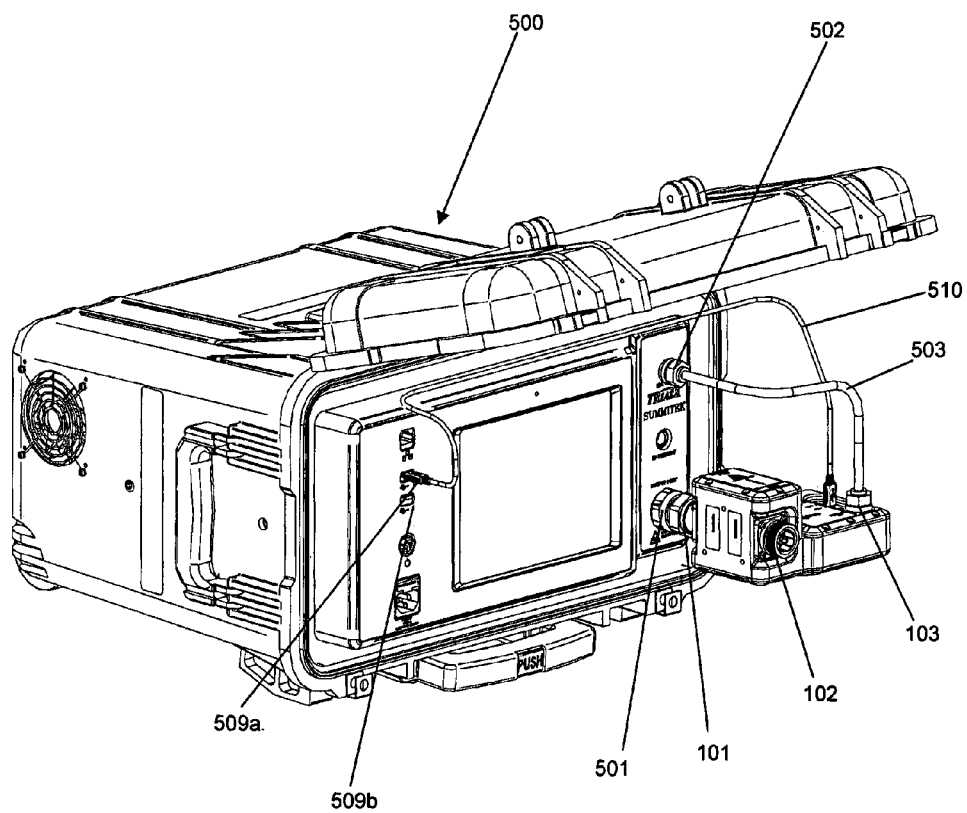
FIG. 5 is a mechanical drawing depicting the interconnection of the module of FIG. 1 with a PIM analyser.

The examples of the RTF module discussed in relation to FIGS. 2 and 3 above are single-band devices, designed for operation in only one cellular frequency band. However, the RTF module 100 could easily be configured for multi-band operation. This is achieved by utilising a reference receiver module 206 of the type shown in FIG. 4. In this arrangement of the reference receiver module 206 the SAW filter 206b at the input to the reference receiver 206 is replaced by a bank of SAW filters 406b, one for each Tx band of interest, which can be switched into the RF path as needed.

These SAW filters are chosen to cover the Tx band of each cellular standard of interest, such as AWS, PCS1900, DCS1800, GSM900, CDMA850 and so on. The only requirement is that each Tx SAW filter must have high attenuation (i.e. greater than 80 dB) in the corresponding Rx band for that standard. In some cases a single SAW filter may not provide sufficient rejection for this purpose, in which case two or more SAW filters could be connected in cascade to achieve the desired performance.

In order to switch between the SAW filters, the original single-pole double throw switches 206a & 206c are also replaced by a pair of single-pole six-throw switches 406a, 406c. One of the six switch settings is a pass-through connection with no SAW filters at all. This setting is used when the instrument is in its Range-to-VSWR mode of operation.

Figure 11:
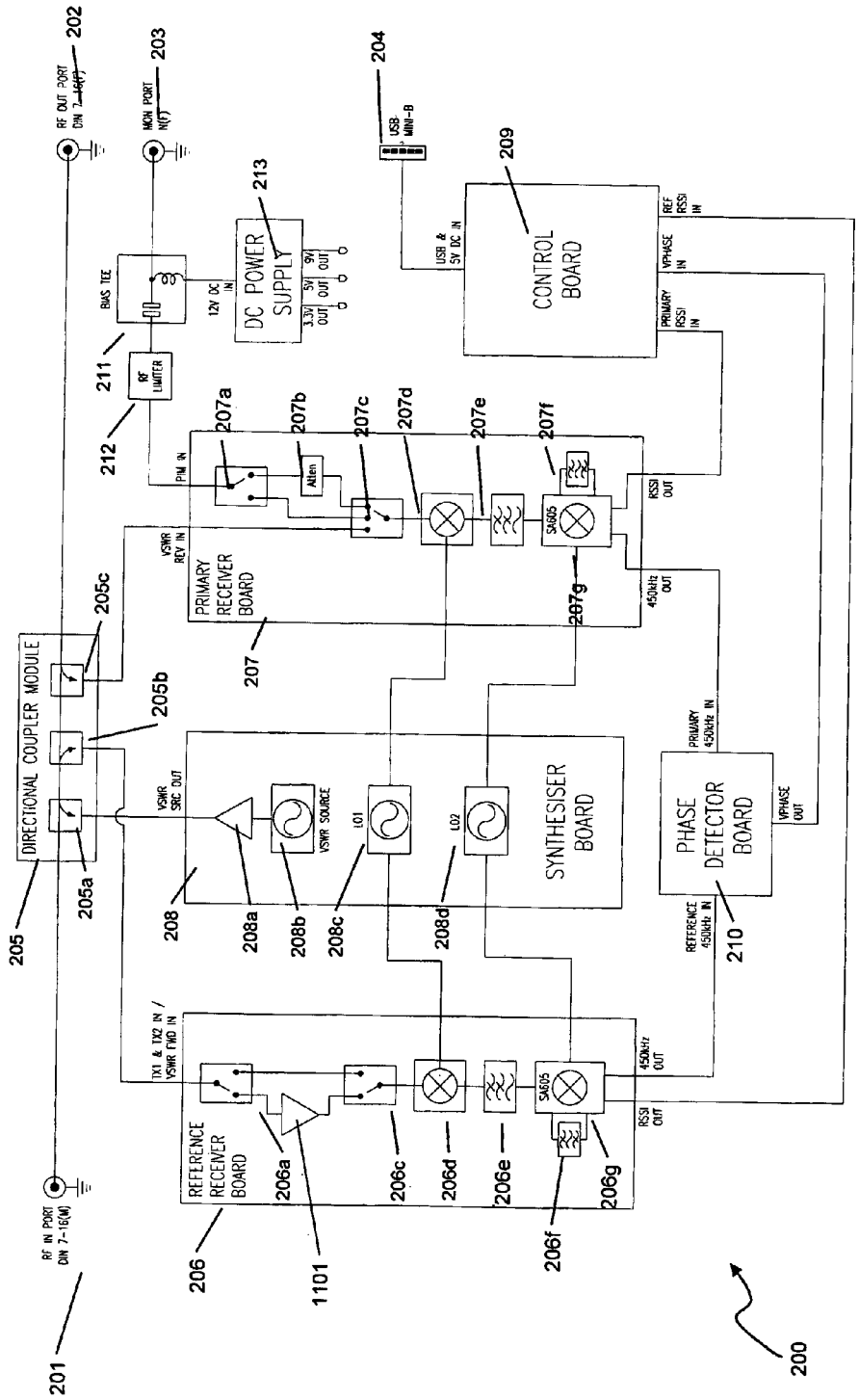
FIG. 11 is a circuit diagram depicting an alternate arrangement of a reference receiver module for use in the range to fault module according to one embodiment of the present invention.

An alternative means of configuring the RTF module for multi-band operation is to utilise a reference receiver module 206 of the type shown in FIG. 11. In this arrangement of the reference receiver module 206, the SAW filter 206b at the input to the reference receiver 206 is replaced by a wideband monolithic amplifier 1101. When the RTF module is in Range-to-PIM mode, the amplifier allows the sampled $Tx_1$ and $Tx_2$ carriers to pass through to the downconverter chain, while preventing any PIM signals generated in downstream circuit elements from propagating back into the iQA's test port via the forward coupler 205b. The monolithic amplifier has an operating frequency range of DC to 3 GHz, which allows the reference receiver module to be used in all existing cellular frequency bands.

The only other devices in the RTF module that limit its multi-band utility are the directional couplers 205a, 205b, 205c, and the power dividers that split the first and second frequency synthesisers 208c and 208d respectively between the two receiver modules. Additionally, in the case of the six-port reflectometer embodiment discussed in relation to FIG. 3 above, the properties of the six-port junction are frequency dependent. Therefore in order to optimise the performance of the RTF module across multiple cellular frequency bands, the above components may need to be upgraded to devices spanning an octave or more of bandwidth. Alternatively, the multi-band option could be implemented in two variants: a "low-band" variant covering for example 700 MHz, CDMA850 and GSM900, and a "high-band" variant covering for example AWS, DCS1800 and PCS1900.

As noted above the RTF is utilised in conjunction with a PIM analyser 500 generally of the type discussed in the applicant's earlier filed U.S. application Ser. No. 11/936,968 and U.S. Ser. No. 11/941,712. As shown the RTF module 100 is directly coupled to the test port of the PIM analyser via its input port 101. While RTF module is shown as being directly connected to the test port 501 of the analyser 500 it will of course be appreciated by those of skill in the art that the module could be coupled to the test port 501 via the use of a suitable RF jumper cable. The monitor port 103 of the RTF module 100 in this case is coupled to the PIM analyser's monitor port 502 via cable 503, while at least one of the USB ports 104a, 104b is coupled to one of the USB ports 509a, 509b via USB cable 510.

As mentioned above the PIM analysers of the type discussed in U.S. Ser. No. 11/936,968 and U.S. Ser. No. 11/941,712 require a slight modification to allow the analyser 500 to utilise the RTF module 100 to detect PIM and VSWR faults in the device under test such as for example the addition of the monitor port. In addition to this an application software update is also required to access the new features associated with the RTF module.

Figure 6:
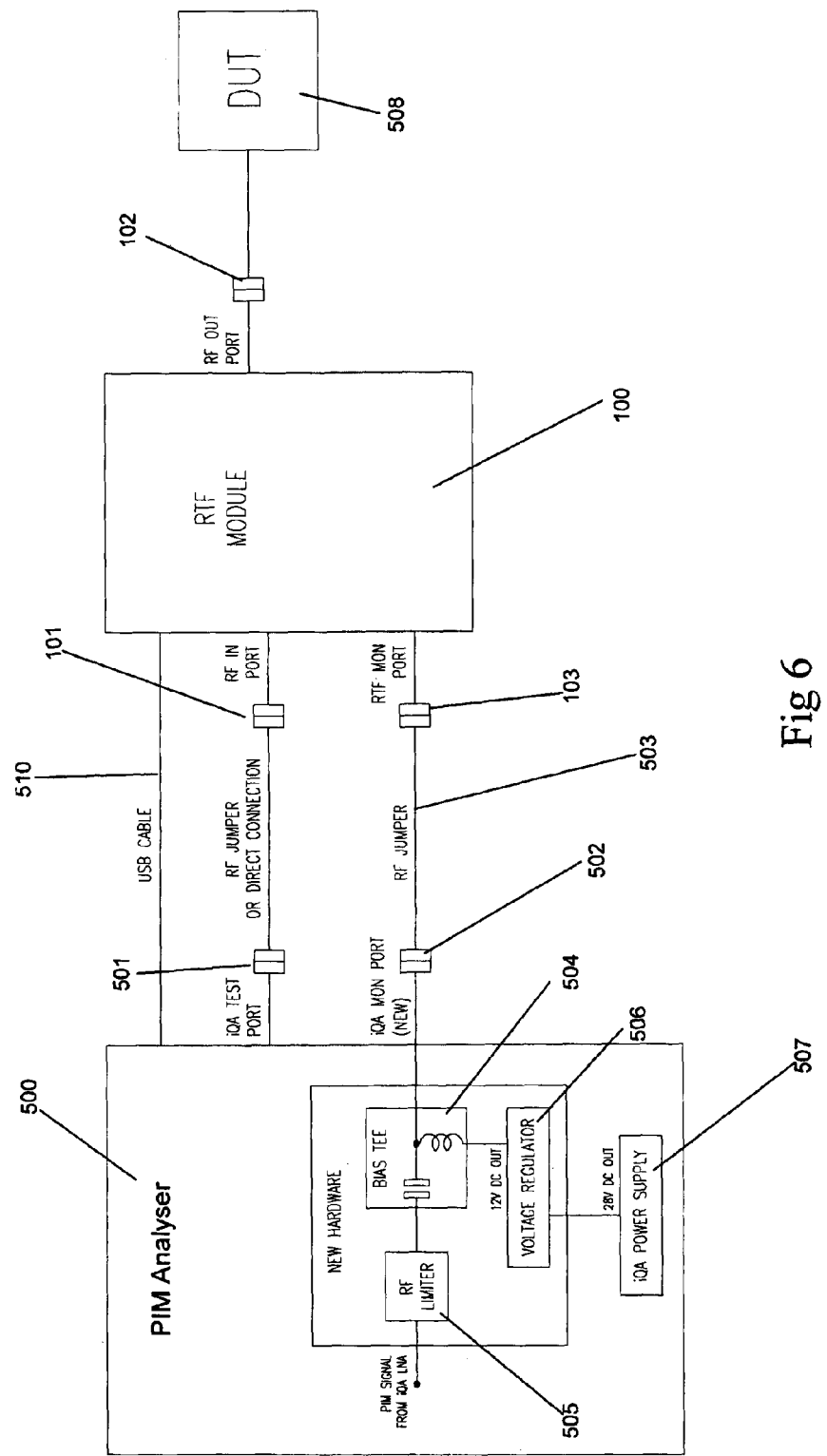
FIG. 6 is a circuit diagram depicting the interconnection of the module of FIG. 1 with a PIM analyser.

FIG. 6 depicts one possible configuration of a system for detecting faults in a cable network utilising a modified PIM analyser 500 and RTF module 100. As discussed above the PIM analyser 500 is modified to include a monitor port 502 on the front panel, from which an amplified version of the PIM signal is transmitted to the RTF module 100. The modified analyser also requires an internal bias tee 504 to insert a DC voltage onto the monitor port 502, so that the RTF module 100 can be powered by the analyser's power supply 507. An RF limiting circuit 505 is also needed to protect the analyser from damage by erroneous connection of a strong signal source to the monitor port. In addition to these modifications the analyser may also be provided with new application software, graphical user interface and device drivers to give the user access to the Range-to-PIM and Range-to-VSWR functions. The analyser's firmware may also be upgraded to a newer version to enable additional test options.

To facilitate the location of faults within the cable network the RTF module 100 is connected between the analyser 500 and the device under test 508, such that the RTF module's input port 101 is coupled to the analyser's test port 501 either directly or via an RF jumper cable, while the RTF module's monitor port 103 is coupled to the analyser's monitor port 502 via RF jumper cable 503. The device under test is then connected to the RF output port 102 of the module 100. At least one of the USB ports 104a, 104b from the RTF module 100 is also coupled to one of the USB ports 509a, 509b of the analyser 500 via USB cable 510.

The above modifications to the PIM analyser provide the system with a number of additional functions not previously available with the unmodified versions of the PIM analyser such as:

Sweep setup screen for Range-to-PIM and Range-to-VSWR analysis.
On-screen plots of PIM vs distance, return loss vs distance, or an overlay of the two.
On-screen plot of return loss vs frequency, displayed as either a magnitude plot or Smith chart.
Advanced marker functions that enable the user to compare results between the PIM and VSWR domains Advantageously the system allows the operator to alternate between Range-to-PIM and Range-to-VSWR testing without changing any of the test port connections. It is even possible for the instrument to perform both types of measurement simultaneously if desired. The operation of the system in the various available test modes is described in greater detail below.

In Range-to-PIM mode the system requires the PIM analyser 500 and the RTF module 100 to make a synchronised series of measurements across a range of discrete frequency points. At each frequency point in the sweep, the PIM analyser 500 starts by sending the current PIM frequency to the RTF module 100 via the USB link 510 between the two instruments. This enables the RTF module to tune its two receivers 206, 207 to the same frequency as the receiver in the PIM analyser 500.

The PIM analyser then emits a pair of high-power CW carriers from its test port 501, as discussed in the applicant's earlier filed Australian provisional application AU 2010903266 entitled "Method and Apparatus for Locating Faults in Communications Networks" which is herein incorporated by reference. These carriers enter the RTF module 100 via its input port 101. As the carriers propagate through the RTF module 100 they are sampled by the forward coupler 205b in the directional coupler module 205. The sampled carriers are then fed into the reference receiver module 206 inside the RTF module 100, which generates a spectrum of PIM products whose role is to provide a phase reference for the system. The desired PIM product is downconverted to 450 kHz and applied to the reference port of the phase detector module 210.

The original two high-power carriers continue through the RTF module 100, emerging from the output port 102. They then propagate into the DUT, where a PIM signal is generated by the faulty components therein. The PIM signal propagates back out of the DUT, through the RTF module 100 and into the test port 501 of the PIM analyser 500.

As it enters the PIM analyser 500 the PIM signal is isolated from the two high-power carriers by the PIM analyser's triplexer, as described in the applicant's earlier filed Australian provisional application AU 2010903266. The PIM signal is then amplified by the low-noise amplifier at the front end of the PIM analyser's receiver module. After amplification the PIM signal is split into two equal parts by a 3 dB power divider. One half of the PIM signal enters the PIM analyser's downconverter chain, which has previously been described in the applicant's earlier filed provisional AU 2010903266. The other half of the PIM signal undergoes a further stage of amplification, and emerges from the PIM analyser's transceiver stack via a board-mounted QMA connector. The PIM signal then passes through a short length of coaxial cable, emerging from the PIM analyser's monitor port 502, after which it propagates into the RTF monitor port 103.

As the PIM signal enters the RTF module it is routed to the primary receiver module 207, which downconverts the PIM signal to 450 kHz. The phase of the downconverted PIM signal is then measured relative to the reference PIM signal described earlier. This is achieved by means of the RTF module's phase detector module 210. The measured phase offset is recorded by the RTF module's control module 209. Also recorded are the amplitudes of the primary & reference PIM signals. While these values are not strictly required by the measurement process, they nevertheless provide a useful indication of whether or not the RTF module is functioning correctly.

The RTF module's control module 209 reports the measured phase offset and signal amplitudes to the PIM analyser via the USB link 510 between the two instruments. The PIM analyser stores these values to file, along with the PIM level as measured by its own receiver. The PIM analyser then sets one of its high-power carriers to the next frequency in the sweep, and the above process repeats.

Upon completion of the frequency sweep, the touch-screen PC inside the PIM analyser post-processes the measured data in order to compute the locations and severities of the PIM faults in the DUT. The results are displayed on screen in a graphical format, and can be saved as a report on the PC's hard drive if desired.

In addition to Range-to-PIM mode, the system has a Low-power Range-to-VSWR mode. Low-power. Range-to-VSWR mode will in most cases be the preferred method of locating VSWR faults. As the name implies, this is a low-power test which can be performed in both the transmit and receive bands of the PIM analyser. It requires the RTF module to make a series of vector reflection coefficient measurements across a range of discrete frequency points, followed by a post-processing operation in the PIM analyser. The PIM analyser's two high-power carriers are not required when the apparatus is operating in this mode, and would normally be turned off for the duration of the test.

At each frequency point in the sweep, the PIM analyser 500 starts by sending the desired measurement frequency to the RTF module 100 via the USB link 510 between the two instruments. The RTF module programs its VSWR source synthesiser 208*b* to this frequency. The output of the synthesiser is then boosted to a power level of approximately +15 dBm by the VSWR driver amplifier 208*a*.

The amplified VSWR stimulus signal is injected onto the main RF path via the directional coupler 205*a*. The power level of the coupled signal on the main RF path is approximately −15 dBm. This is low enough to perform testing in both the Tx and Rx bands of the PIM analyser without causing damage to either the instrument or any active devices in the DUT.

The stimulus signal propagates through the RTF module 100 in the direction of the DUT. As it does so, the signal is sampled by the forward directional coupler 205*b* in order to provide a reference signal against which the amplitude and phase of the reflected signal can be compared. The sampled stimulus signal is fed into the reference receiver module 206 inside the RTF module, which downconverts the signal to 450 kHz and applies it to the reference port of the phase detector module 210.

The original VSWR stimulus signal continues through the RTF module, emerging from the output port 102. It then propagates into the DUT, where it is back-scattered by the faulty components therein. The reflected part of the stimulus signal propagates back out of the DUT and into the output port 102 of the RTF module 100.

As the reflected stimulus signal propagates through the RTF module 100, it is sampled by the reverse directional coupler 205*c*. The sampled signal enters the primary receiver module 207, which downconverts the signal to 450 kHz.

The phase of the reflected signal after downconversion is then measured relative to that of the reference signal described above. This is achieved by means of the RTF module's phase detector module 210. The measured phase offset is recorded by the RTF module's control module 209. Also recorded are the amplitudes of the reference & reflected signals.

The RTF module's control module reports the measured phase offset and signal amplitudes to the PIM analyser via the USB link 510 between the two instruments. The PIM analyser stores these values to file. The PIM analyser then sends the next frequency in the sweep to the RTF module, and the above discussed process is repeated.

Upon completion of the frequency sweep, the touch-screen PC inside the PIM analyser post-processes the measured data in order to compute the locations and severities of the VSWR faults in the DUT. The results are displayed on screen in a graphical format, and can be saved as a report on the PC's hard drive if desired.

As a final note, it is possible in principle for the present invention to perform low-power Range-to-VSWR measurements over a very wide range of frequencies, including frequencies outside of the Tx and Rx bands of the PIM analyser. However, in general this is not recommended, as accurate results cannot be guaranteed for all load impedances, in particular for highly reflective terminations, unless the RTF module is disconnected from the test port 501 of the PIM analyser, and a 50 ohm load attached to the RTF module's input port 101.

The system also has a High-power Range-to-VSWR mode. This mode is very similar to the low-power case, except that the stimulus signal is provided by the PIM analyser. As such, testing can be performed at power levels ranging from +33 to +43 dBm. This is advantageous in situations where the user wishes to test the DUT at a power level that is more representative of normal operating conditions. It is also advantageous in situations where external interference signals are present in the system; whereas typical interference signal levels would be expected to cause large errors in the measured return loss when the apparatus is in low-power VSWR mode, their effect will generally be insignificant when the apparatus is in high-power VSWR mode.

High-power Range-to-VSWR testing can only be performed at frequencies within the Tx band of the PIM analyser. At each frequency point in the sweep, the PIM analyser 500 starts by sending the desired measurement frequency to the RTF module 100 via the USB link 510 between the two instruments. This enables the RTF module to tune its two receivers 206, 207 to the correct frequency to detect the stimulus signal. The RTF module's VSWR source synthesiser 208*b* and driver amplifier 208*a* are not required when the apparatus is operating in this mode, and would normally be turned off for the duration of the test.

The PIM analyser then turns on one of its high-power carriers. This carrier is emitted from the PIM analyser's test port 501, and enters the RTF module 100 via the input port 101. From this point onwards the measurement process is identical to that of the low-power Range-to-VSWR mode described above, with the exception that a pair of large attenuators must be switched into the RF paths at the inputs to the primary 207 and reference 206 receivers in the RTF module 100. This is to ensure that the sampled forward and reflected stimulus signals remain within the dynamic range of the receivers.

In an alternative embodiment, instead of using switchable attenuators as described above, the RF switches 206*a*, 206*c*, 207*c* at the inputs to the two receivers could be set in such a way as to achieve the same outcome. For example, the first switch 206*a* in the reference receiver could be set to the normal position for VSWR testing, whereas the second switch 206*c* could be set to the position used in Range-to-PIM mode. In this configuration, the isolation of the RF switch 206*c* acts as an attenuator, reducing the strength of the signal at the downconverter input to a more suitable level. Similarly the switch 207*c* in the primary receiver could be set to one of the PIM inputs from the monitor port, thereby attenuating the VSWR REV signal by an amount equal to the isolation of the switch.

With the system of the present invention it is possible to perform Range-to-PIM and Range-to-VSWR testing almost simultaneously. This applies to both low-power and high-power VSWR testing. To perform simultaneous Range-to-PIM and low-power Range-to-VSWR testing, the PIM analyser's pair of high-power carriers and the RTF module's VSWR source 208b, 208a are all turned on at the same time. Range-to-PIM and Range-to-VSWR measurements can then be made in two arbitrary and independent frequency bands.

Every time the system switches from a PIM measurement to a VSWR measurement, the RTF module must be configured accordingly. This entails setting the RF switches 206a, 206c, 207a, 207c in the primary and reference receivers to the correct positions, and programming the first local oscillator 208c to the appropriate frequency for the current measurement. The only restrictions on this mode of operation are that the VSWR source must not be set to the same frequency as either of the two carriers from the PIM analyser, or to the frequency of the PIM product currently being measured.

To perform simultaneous PIM and high-power VSWR testing, the PIM analyser's two carriers are turned on, while the RTF module's VSWR source 208b, 208a must be turned off. A Range-to-PIM sweep is then carried out as described above. The only change in the measurement procedure is that after PIM has been measured at a given frequency point, the RF switches 206a, 206c, 207a, 207c and first local oscillator 208c in the RTF module 100 must be configured for a VSWR measurement at the frequency of the swept carrier. It is not necessary to turn off the second carrier during this process. After the reflection coefficient has been measured, the RTF module is returned to PIM mode, and the system moves onto the next frequency point.

The only restriction with this mode of operation is that the VSWR sweep must necessarily be performed at the same frequencies as those covered by the swept carrier in the PIM sweep.

The RTF module must be calibrated for both Range-to-PIM and Range-to-VSWR operation. Each calibration consists of a two-part procedure. The first part is performed in the factory during the manufacturing process. The second part is a field calibration procedure which must be carried out by the user on a periodic basis, typically once a day. Details of these calibration procedures are presented below.

The power calibration procedure for the primary receiver module 207 characterises the relationship between the RF signal level at the input to the receiver and the RSSI voltage at the output of the receiver. The RTF module is first disconnected from the PIM analyser. The input 101 and output 102 ports of the RTF module 100 are terminated in 50Ω matched loads, and an external bias tee is connected to the monitor port 103 in order to provide DC power to the apparatus. An external signal generator is connected to the RF input port of the bias tee, and the RF switch 207c at the receiver's front end is switched to the PIM input port. The signal generator then injects a tone of known frequency and power into the monitor port, and the RSSI signal at the output of the primary receiver 207 is recorded. This process is repeated at a large number of frequencies and power levels across the full operating range of the instrument, both with and without the RF attenuator 207b in circuit. The results are stored in a lookup table in the control module's EEPROM.

The power calibration procedure for the reference receiver module 206 characterises the relationship between the RF signal level at the input to the receiver and the RSSI voltage at the output of the receiver. The RTF module 100 is disconnected from the PIM analyser 500. The output port 102 of the RTF module 100 is terminated in a 50Ω matched load, and an external signal generator is connected to the RF IN port. An external bias tee is connected to the monitor port 103 in order to provide DC power to the RTF module. The RF switching network at the receiver's front 206a, 206c is then set to VSWR mode. The signal generator injects a tone of known frequency and power into the RF IN port, and the RSSI signal at the output of the reference receiver 206 is recorded. This process is repeated at a large number of frequencies and power levels across the full operating range of the instrument. The results are stored in a lookup table in the control module's EEPROM.

The above process must then be repeated across the Tx band of the PIM analyser with the RF switching network set to PIM mode. This switches the SAW filter 206b into the RF path, thereby enabling the system to characterise the pass-band ripple of the filter (or the gain slop of the monolithic amplifier, if the embodiment of FIG. 11 is employed). These results are stored in EEPROM in a separate lookup table.

The phase detector, calibration characterises the relationship between the phase offset between the two 450 kHz square waves at the input to the phase detector 210 and the voltage $V_{phase}$ at the output of the phase detector. The RTF module is first disconnected from the PIM analyser 500, and the output port 102 is terminated in a 50Ω matched load. An external bias tee is connected to the monitor port 103 in order to provide DC power to the RTF module. A variable phase shifter is connected to the RF input port of the bias tee. The RF switching network at the input to the primary receiver is switched to the PIM input port, while the RF switching network at the input to the reference receiver is switched to the VSWR FWD port.

Using an external signal generator with a power divider on its output port, a −15 dBm RF tone with its frequency set to the middle of the Rx band of the PIM analyser is applied simultaneously to both the RF IN port of the RTF module and the input port of the variable phase shifter attached to the monitor port. The phase shifter is then stepped through a full 360° phase rotation in increments of 5 to 10°. At each phase setting the output voltage $V_{phase}$ is recorded. Upon completion of this process the results are stored in a lookup table in the control module's EEPROM.

In an alternative approach, the phase detector calibration could be achieved using a pair of phase-locked signal generators, one of which has an adjustable output phase capability. As before, an external bias tee is connected to the monitor port 103 in order to provide DC power to the RTF module. The fixed-phase signal generator is connected to the RF input port of the bias tee, while the variable-phase signal generator is connected to the monitor port. Both signal generators are then set to the same frequency, preferably near the middle of the RTF module's operating frequency range. The output phase of the signal generator on the monitor port is then stepped through a full 360° phase rotation in increments of 5 to 10°. At each phase setting the output voltage Vphase is recorded. Upon completion of this process the results are stored in a lookup table in the control module's EEPROM. The above procedure could be performed under computer control if desired.

The Range-to-PIM calibration procedure establishes a reference plane for the RTF module when it is operating in Range-to-PIM mode. This procedure must be performed by the user on a regular basis, preferably once per day if the instrument is in frequent use. The first step in the calibration process is to attach a strong, stable PIM source directly to the test port of the RTF module. In the preferred embodiment a Kaelus PIS0002F1V1 PIM source is recommended for this purpose, as it is part of the standard PIM analyser accessories kit. The Kaelus PIM source produces approximately −77 dBm of IM3 with two +43 dBm carriers. Next, a swept PIM measurement is performed across the frequency band of interest, with the phase offset between the primary and reference PIM signals being recorded at each frequency point. Finally, the measured phase offsets are stored to a file on the PIM analyser's hard drive. When performing subsequent Range-to-PIM measurements, these phase offsets are subtracted from the measured phase of PIM signal, thereby referencing the Range-to-PIM results to the RF OUT connector of the RTF module.

The low-power Range-to-VSWR calibration is a vector error correction procedure that enables raw amplitude and phase measurements from the primary and reference receivers to be converted into accurate measurements of the vector reflection coefficient of the DUT. Ideally the calibration should be performed by the user on a regular basis, preferably once per day if the instrument is in frequent use. However less frequent calibrations are permissible if pinpoint measurement accuracy is not required.

The preferred calibration method is an Open-Short-Load (OSL) procedure similar to that used with Vector Network Analysers to perform S11 calibrations. As the name implies, the OSL method requires three calibration standards—two reflective terminations and one matched load—whose complex reflection coefficients are known at every frequency at which the apparatus is to be calibrated. At the commencement of the calibration procedure, the RF switches in the primary and reference receivers are switched to their VSWR REV and VSWR FWD positions respectively.

The calibration standards are then connected to the RF OUT port of the RTF module one by one, and the VSWR source 208*b* is turned on and swept across the band of interest in suitably small frequency increments. At each frequency the outputs from the primary receiver, reference receiver and phase detector module are measured, and a set of complex calibration coefficients are calculated. Upon completion of the calibration process, the Range-to-VSWR calibration constants are stored to a file on the PIM analyser's hard drive.

The high-power Range-to-VSWR calibration procedure is identical to the low-power procedure, with the exception that the VSWR stimulus signal is a +43 dBm carrier provided by the PIM analyser, and the calibration can only be performed in the PIM analyser's Tx band. In all other respects, the calibration procedure is the same.

The output from the PIM measurement process described above is a list of magnitudes and phases, with one pair of values for each frequency point in the sweep. This is the case regardless of whether the apparatus is operating in Range-to-PIM mode or Range-to-VSWR mode. These measured parameters may be stored on the PIM analyser's 500 internal hard drive or other such suitable storage medium. In order to compute the locations of the PIM or VSWR faults in the DUT, this raw data must be analysed by the PIM analyser's application software.

Figure 7:
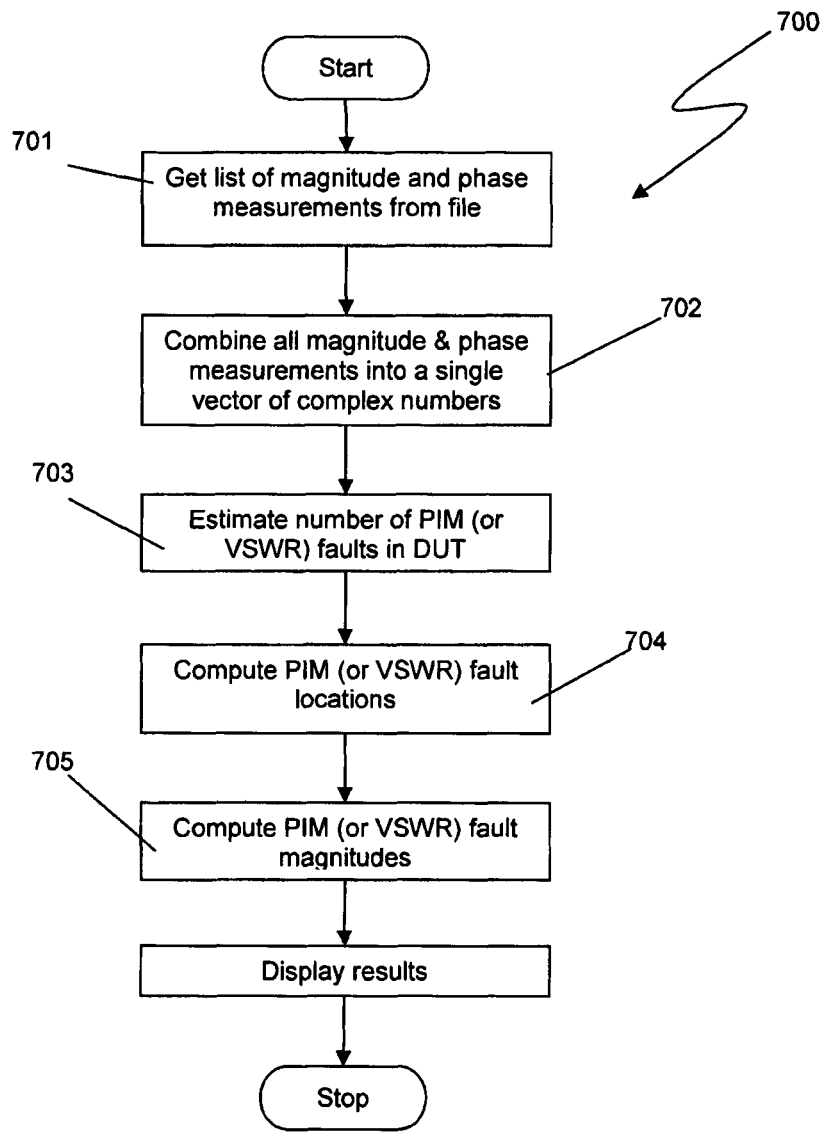
FIG. 7 is a flow chart depicting the operation of the system's fault calculation algorithm according to one embodiment of the present invention.

A flowchart 700 depicting the basic operation of the analyser's application software algorithm for determining the location and magnitude of PIM or VSWR faults depending on the selected test mode is shown in FIG. 7. As shown the algorithm firstly retrieves the list of magnitudes and phases 701. The algorithm then combines the amplitude and phase measurements into a single vector of complex values, one per frequency point 702. Each value in the vector is calculated according to the following equation:

$$H_n = \sqrt{2Z_0 P_n} \exp(j\theta_n)$$

where
- $H_n$ = nth point in complex PIM data sequence
- $P_n$ = power of primary PIM signal (in watts rms) at nth point in sweep
- $\theta_n$ = phase offset (in radians) between primary & reference PIM signals at nth point in sweep; and
- $Z_0$ = characteristic impedance of system (50 ohms)

For best results the signal processing software requires an estimate of the number of PIM faults in the DUT. Several techniques are available to answer this question. The preferred approach in the present case is to construct a system of linear prediction (LP) equations based on complex PIM vector $H_n$. A singular value decomposition (SVD) is then performed on the LP data matrix. The resulting set of singular values is analysed to identify the points in the set for which a 6 dB decrease in magnitude occurs from one singular value to the next. All singular values that are located after the last such transition are then set to zero. At the end of this process, the number of nonzero singular values will be equal to the number of PIM or VSWR faults (depending on the test mode) in the DUT.

Once the number of PIM or VSWR faults has been estimated 703, a modified LP data matrix is reconstituted using the modified singular values from the previous step. The system of LP equations is then solved for the coefficients of the characteristic polynomial using the method of Total Least Squares. This approach is favoured in the current invention because it performs well with weak signals in noisy environments, where the data set is of short duration.

Having found the coefficients of the LP equations, the zeros of the characteristic polynomial are calculated. The locations of the PIM or VSWR faults in the DUT can then be computed directly from these zeros 704.

The magnitude of each PIM fault is determined 705 via the Least Squares Prony method, using the LP coefficients and polynomial zeros computed in the previous steps.

The above discussed process differs from that described in the applicant's earlier provisional application AU 2010903266 in that it does not produce a set of files of digitised waveform data that require pre-processing. Instead, the apparatus contains a dedicated phase detector module 210 that enables the PIM phase (or reflection coefficient phase for VSWR measurements) to be measured directly.

Figure 8A:
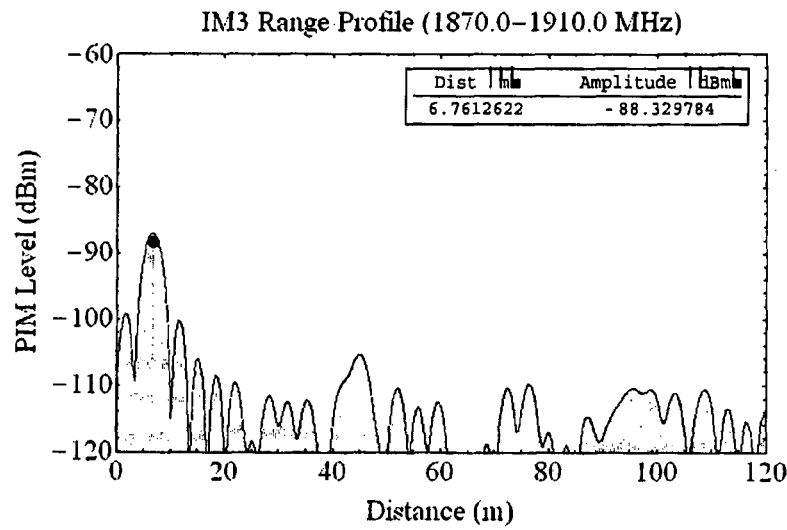
FIGS. 8A to 8C are plots of the results of various range to fault tests that may be performed by the system according to one embodiment of the invention.

The results calculated by the signal processing software can be displayed on-screen in a variety of formats. An example of how the results of a Range-to-PIM sweep might be displayed is shown in FIG. 8A. The shaded curve is the unenhanced range profile, which is obtained by simply taking the inverse Fourier transform of the swept PIM data after rectangular windowing. The discrete marker shows the estimated PIM fault location according to the resolution enhancement algorithm.

Figure 8B:
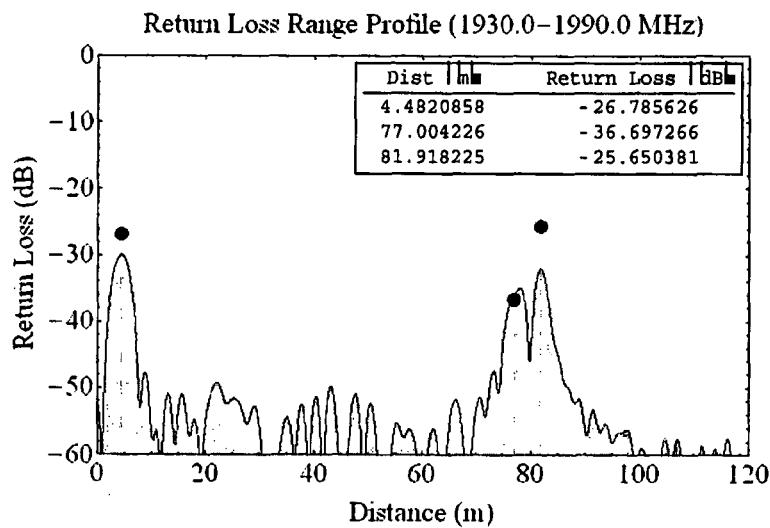

An example of how the results of a Range-to-VSWR sweep might be displayed is shown in FIG. 8B. The shaded curve is the unenhanced range profile, which is obtained by simply taking the inverse Fourier transform of the swept reflection coefficient data after rectangular windowing. The discrete markers show the estimated VSWR fault locations according to the resolution enhancement algorithm.

By default the results are presented with units of Return Loss in dB, but other formats such as VSWR or linear magnitude are also possible.

Figure 8C:
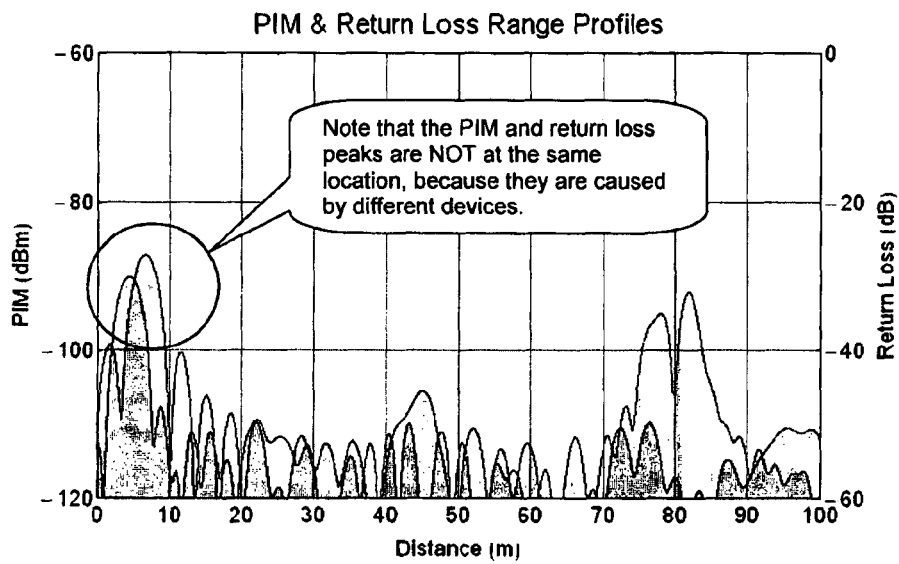

Another display option offered by the RTF software is an overlaid plot of the PIM and VSWR results, as shown in FIG. 8C. This plot format is particularly useful when the PIM fault is located near the top of a tall tower. In that situation the first step is to use the Range-to-VSWR trace estimate the distance to the antenna or low-PIM load at the top of the tower. These components usually show up clearly on a Range-to-VSWR trace, even in very well-matched systems. The Range-to-PIM trace can then be used to estimate the distance to the PIM fault relative to the antenna or low-PIM load. This is much easier in a real-world environment than trying to measure the distance to a PIM fault relative to the test instrument at the bottom of the tower.

To aid in this process the system software allows the user to place markers on each trace which print precise distance and amplitude information on the screen. It is also possible to measure the distance between any two markers, even if one is on the PIM trace and one is on the VSWR trace.

If desired, the system may generate a report for the user in Excel or PDF format, complete with a time/date stamp and geographical location information (provided by the user). The finished report can then be transferred to another PC using a USB memory stick, or by connecting a USB cable between the PIM analyser and the PC, and transferring the report using Windows Explorer.

It will of course be appreciated by those of skill in the art that the Total Least Squares (TLS) Prony Estimator described above is only one of many available resolution enhancement techniques.

In an alternative embodiment, the TLS Prony Estimator could be replaced by a Modified Covariance Estimator. This entails fitting an autoregressive process model to the measured data, and then extrapolating the model over a wider bandwidth, effectively enhancing the resolution of the measurement. The Modified Covariance method is applicable to both Range-to-PIM and Range-to-VSWR analysis.

Figure 12:
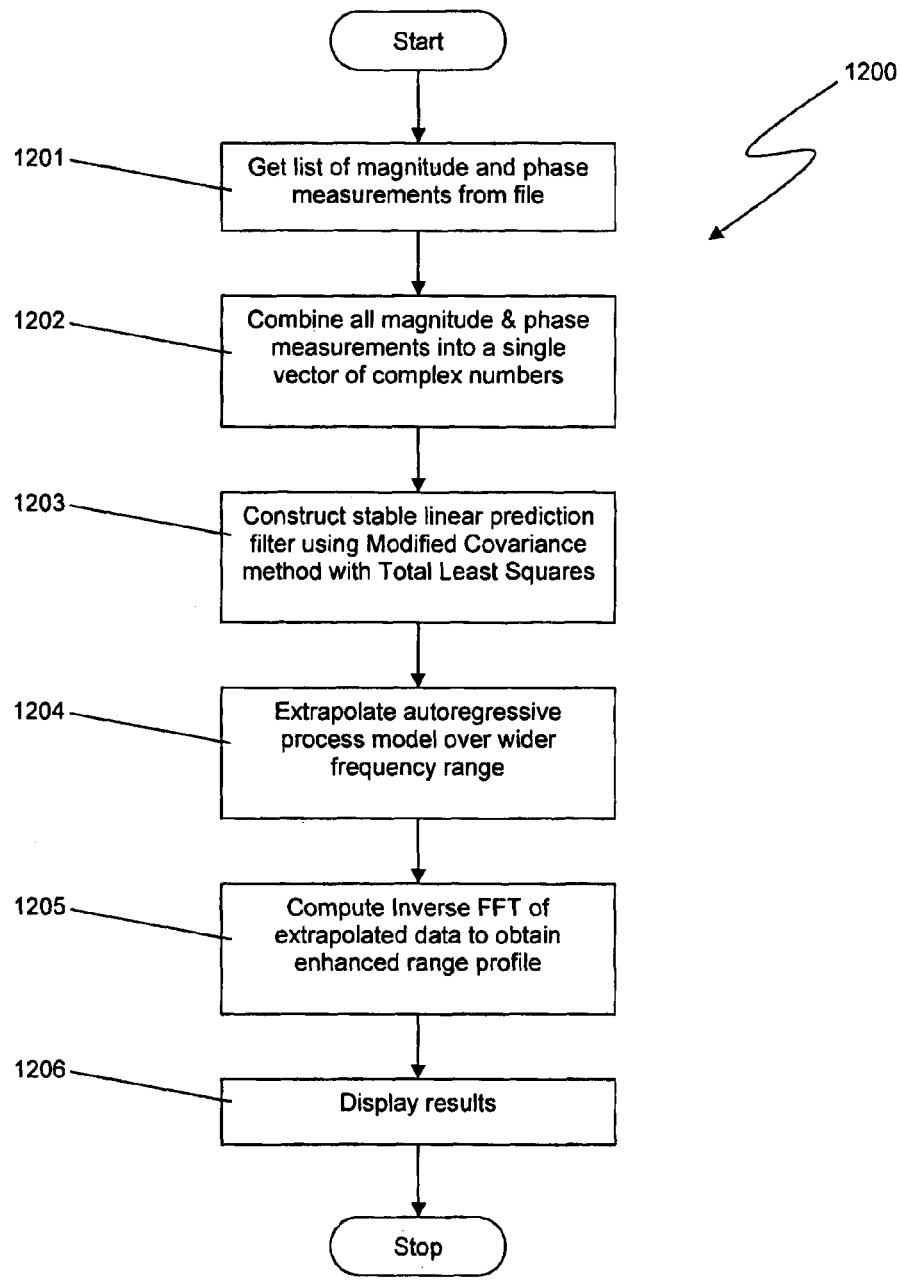
FIG. 12 is a flow chart depicting the operation of an alternate fault calculation algorithm according to one embodiment of the present invention.

A flowchart 1200 depicting the basic steps of a Modified Covariance software algorithm for determining the location and magnitude of PIM or VSWR faults depending on the selected test mode is shown in FIG. 12. As shown the algorithm firstly retrieves the list of magnitudes and phases 1201 that were obtained during the measurement sweep. The algorithm then combines the magnitude and phase measurements into a single vector of complex values, one per frequency point 1202.

The next step is to construct a system of forward and backward linear prediction equations based on the measured PIM or reflection coefficient data.

The system of equations is then solved for the coefficients of the characteristic polynomial. This can be performed using either a conventional least-squares approach, or more sophisticated techniques like Total Least Squares.

The resulting coefficients are substituted into the characteristic polynomial to verify that it produces a stable linear prediction filter. This entails solving for the roots of the characteristic polynomial and ensuring that all lie inside the unit circle. Any poles found outside the unit circle can be moved inside it by simply inverting their magnitudes, thereby guaranteeing the stability of the filter 1203.

The linear prediction filter may then be utilised to extrapolate the measured data over a wider bandwidth 1204. This entails substituting the measured data into the linear prediction filter, which then predicts the PIM or reflection coefficient at the first frequency point outside the measured range. The predicted value can then be substituted back into the filter as if it were a measured data point, and used to predict the value at the second frequency point outside the measured range. This process is repeated in both the forward direction (i.e. increasing frequency) and backward direction (i.e. decreasing frequency), until the measured data has been extrapolated over a sufficient bandwidth to provide the required spatial resolution. Finally the inverse Fourier transform of the extrapolated data is taken 1205, which produces a range profile that can be displayed on screen in a graphical format 1206.

Figure 9:
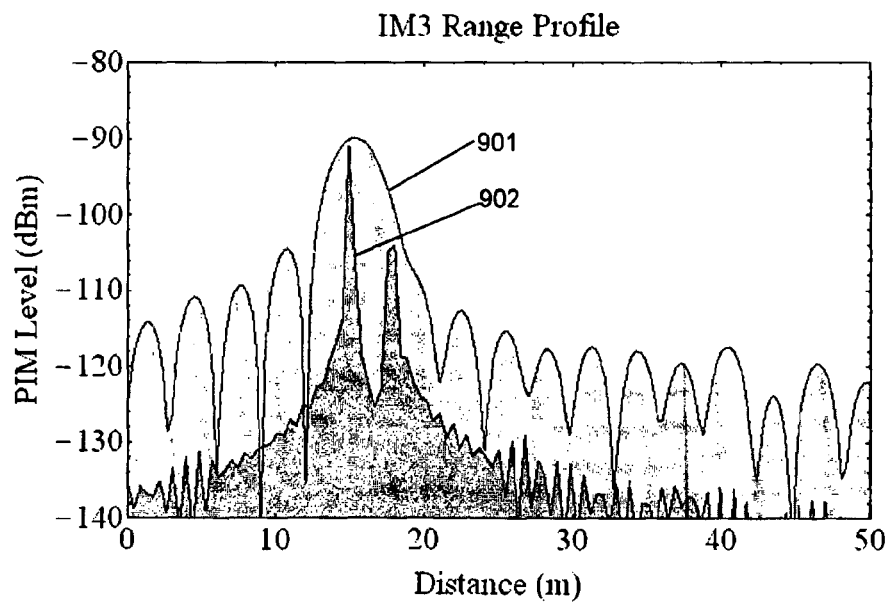
FIG. 9 is a plot of the results of a range to fault test utilising an alternate fault calculation algorithm according to one embodiment of the present invention.

A simulated example of the performance of a Modified Covariance estimator compared to a simple inverse Fourier transform of the original data is shown in FIG. 9. In this example the DUT contains two PIM faults: the first at 15 m with a level of −90 dBm, the second at 18 m with a level of −100 dBm. A noise floor of −110 dBm and a cable velocity factor of 82% have been assumed.

In the case of the unenhanced range profile 901, there is a large peak at 15 m corresponding to the biggest PIM fault, but no peak is visible for the smaller PIM fault at 18 m. This is due to the low spatial resolution (approx 3 m) of this measurement, which is restricted by the limited sweep bandwidth (40 MHz).

By contrast, the range profile produced by the Modified Covariance estimator 902 contains two clear peaks corresponding to the two PIM faults. A bandwidth extrapolation factor of 7 was used in this example, which means that the effective bandwidth of the Modified Covariance "measurement" was 7 times the actual sweep bandwidth, i.e. 280 MHz. This corresponds to a spatial resolution of 0.44 m, a considerable improvement over the unenhanced case. An added benefit of the Modified Covariance estimator is that it often requires no windowing (i.e. zero-padding) of the measured data. This eliminates the large sidelobes and much of the ripple that can be seen on the unenhanced range profile 1501.

While the use of the RTF module 100 of present invention has been described with reference to the specific PIM analysers produced by the applicant, there is no reason why the RTF module 100 could not be adapted to other makes and models of PIM analyser produced by the applicant or other manufactures provided certain requirements are met.

The applicant presently manufactures a variety of PIM analysers besides the PIM analyser referred to in U.S. Ser. No. 11/936,968 and U.S. Ser. No. 11/941,712. The main product families currently marketed are as follows:

iMT—Fixed-frequency 20 W test set with an LED-based results display.

iHA—Fixed-frequency 2 W (and now 4 W) hand-held test set with an LED-based results display.

BPIM—Rack-mounted 20 W test set, capable of swept PIM measurements in both forward and reverse directions, controlled by a Windows PC.

iPA—Fixed-frequency 20 W hand-held test set with a small LCD screen to display results.

In modifying the present invention for use with the above PIM analysers, several minor obstacles must be overcome. The first obstacle to using the above products with the RTF module is that most of them are fixed-frequency instruments, whereas Range-to-PIM measurement is inherently a swept method. Fortunately the fixed frequencies in these products are mainly a software & firmware restriction. All Kaelus PIM analysers are physically capable of performing swept PIM measurements, albeit not over as wide a bandwidth as the PIM analyser referred to in U.S. Ser. No. 11/936,968 and U.S. Ser. No. 11/941,712.

Figure 10:
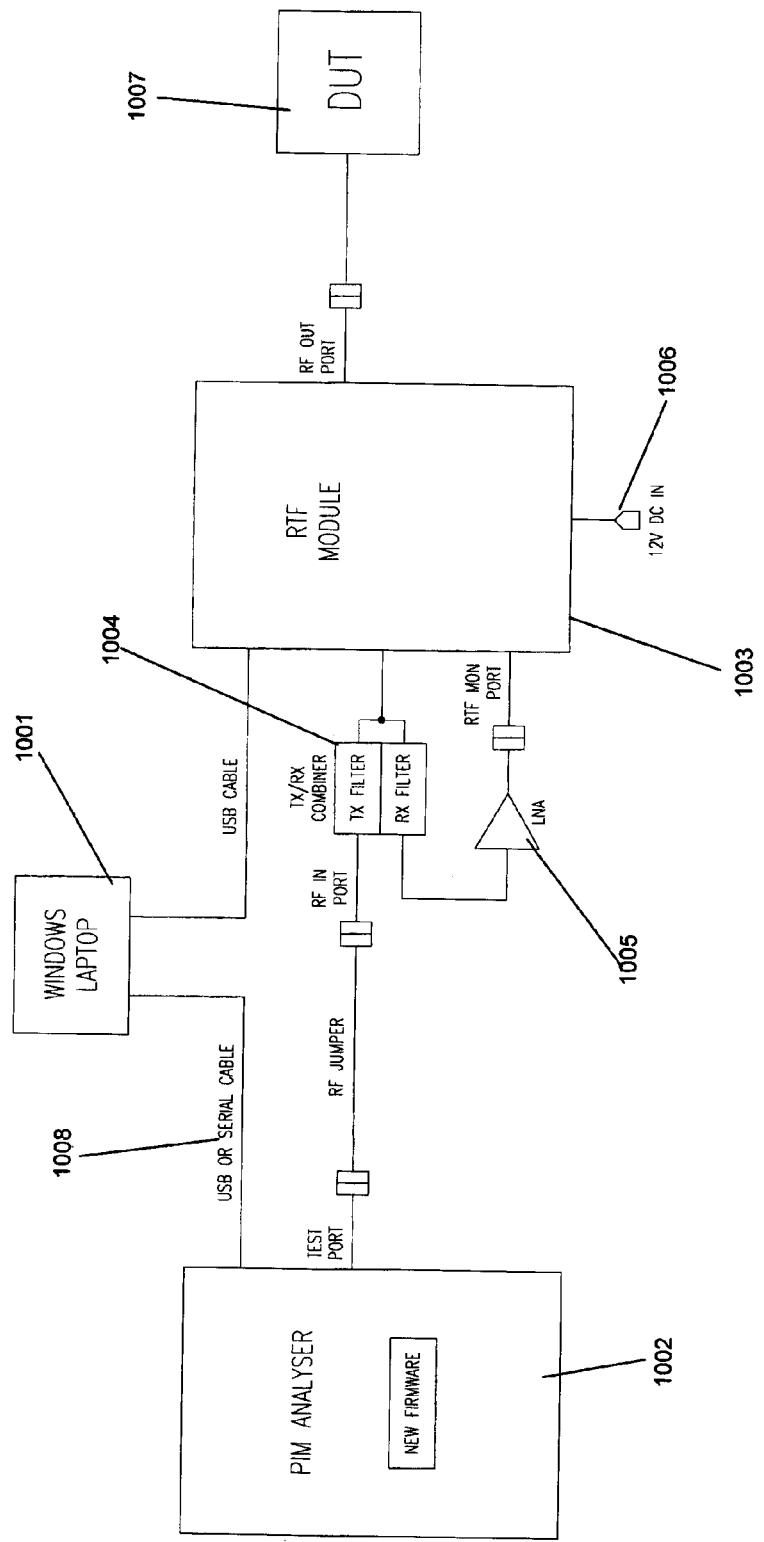
FIG. 10 is a schematic block diagram depicting one possible arrangement of interfacing the test module with a PIM analyser.

In addition, none of the above products have a built-in Windows PC like the PIM analyser's touch-screen PC. Instead, they have very simple push-button user interfaces connected to an on-board microcontroller. As such, there is no way for these instruments to communicate with the RTF module. Even if they could, they would be unable to display a set of results as rich as a Range-to-PIM or Range-to-VSWR trace. To solve this problem, it is likely that these products would need to be modified in such a way that they could be controlled by a laptop computer, as shown in FIG. 10. The laptop 1001 would be responsible for triggering and coordinating each measurement sweep, collecting readings from the PIM analyser 1002 and RTF module 1003, and then post-processing and displaying the results.

Moreover not all PIM analysers produced by the applicant have an auxiliary port which can be repurposed to act as a monitor port. This means there is no way for the RTF module to get access to an amplified version of the PIM signal that is isolated from the two high-power carriers. The preferred solution to this problem would be to add a Tx/Rx combiner module 1004 and low-noise amplifier (LNA) 1005 to the RTF module, as shown in FIG. 10. The Tx path of the combiner allows the two high-power carriers from the PIM analyser to pass through to the RTF module and thence to the DUT 1007. The Rx path of the combiner captures the PIM return signal from the DUT and isolates it from the high-power carriers. The PIM signal is amplified in the LNA 1005, after which it enters the monitor port of the RTF module.

The final obstacle to be overcome is that not all PIM analysers produced by the applicant are able to provide a DC voltage rail to power the RTF module. In that case it would be necessary to fit a DC input connector 1006 to the RTF module, and ship it with a suitable mains adaptor.

In order to use the RTF module with a PIM analyser of other manufacturers, many of the same challenges described above would have to be addressed. An additional requirement is that the PIM analyser of other manufactures would have to be based on the same measurement technique as the applicant's family of PIM analysers, i.e. two-tone testing with a pair of high-power CW carriers, where at least one of the carriers can be programmed to a range of different frequencies. A further constraint is that it will not usually be possible to change any aspect of the hardware or firmware in the PIM analyser.

In the simplest embodiment it is envisaged that the configuration depicted in FIG. 10 would be the most suitable method for using the RTF module with a PIM analyser produced by other of other manufacturers. In such cases the USB or Serial interface 1008 may need to be replaced with whatever interface is available on the PIM analyser, such as GPIB or SCPI. This of course presupposes that any such remote programming interface is available at all, including an application programming interface (API) that exposes the necessary instrument functionality.

An optional feature that could be added to the RTF module 100 is an AISG modem and bias tee connected to the RF OUT port of the apparatus. This would confer upon the apparatus the following functionality:

Active devices in the cable network such as masthead amplifiers and remote electrical tilt (RET) controllers could be powered up during Range-to-PIM testing. This would be a useful enhancement to the system, as the PIM of active devices can vary significantly between their on and off states.

Antenna downtilt and azimuth angles could be varied during Range-to-PIM testing. This would be useful in situations where antenna PIM is a function of beam angle, due to either internal or external PIM sources.

A self-test mode may also be provided. This would enable the apparatus to perform a number of simple checks that verify the system is functioning correctly. A surprisingly large number of tests are possible; a brief description of some of the most useful ones is provided below.

A simple test to verify that the primary 207 and reference 206 receivers in the RTF module are operating correctly when the module is in PIM test mode is to attach a strong, stable PIM source to its output port 102. The PIM analyser then performs a fixed-tone PIM test with 2×43 dBm carriers, and verifies that the measured PIM level is approximately −77 dBm. At the same time, the RTF module measures the same PIM signal using the primary and reference receivers. The PIM level measured by the primary receiver should agree closely with the PIM analyser's result. The PIM level measured by the reference receiver depends only on the amplitudes of the two high-power carriers, and should fall within a narrow range of known power levels.

One test to verify that the reference 206 receivers in the RTF module are operating correctly when the module is in low-power VSWR mode is to turn off the PIM analyser's two high-power carriers with the RTF module's output port being left unterminated. The RTF module then turns on its VSWR source, sets the frequency to a suitable value, and measures the amplitudes of the primary and reference receiver outputs, and the phase offset between them. All three values should fall within a narrow range of known limits.

The test to verify that the primary 207 and reference 206 receivers in the RTF module are operating correctly when the module is in high-power VSWR mode is substantially identical to the low-power case, except that the stimulus signal is a high-power carrier from the PIM analyser. Also, for safety reasons it is recommended that the RF OUT port of the RTF module be terminated with one of the loads from the PIM analyser's accessory kit, such as the low-PIM load or PIM source.

A test to determine a gain correction factor for the apparatus is also available. The RTF module assumes that the gain of the LNA in the PIM analyser is 38 dB, but in practice this value can vary by ±3 dB from unit to unit. As a result, the PIM level reported by the primary receiver in the RTF module can be in error by the same amount. In order to account for this uncertainty, the following procedure is followed:

Firstly, the RTF module is configured for PIM measurement, and a strong, stable PIM source is attached to its output port 102. The PIM analyser then performs a swept PIM test across its full operating bandwidth using 2×43 dBm carriers. At each frequency in the sweep the PIM analyser measures the PIM level using its own receiver. At the same time, the RTF module measures the PIM signal with its primary receiver 207. By subtracting the PIM analyser's PIM measurements from those of the RTF module, a list of gain correction factors is obtained for the measured frequency range. This information can be stored either on the PIM analyser's hard drive, or in the RTF module's EEPROM.

If necessary the RTF module could be used as a wideband spectrum analyser. By turning off the two high-power carriers in the PIM analyser and monitoring the output power from the primary receiver, the RTF module could monitor incoming signals over a very wide frequency range, well outside of the Tx and Rx bands of the PIM analyser. The main limitation with this mode of operation is that the instrument's noise figure would be over 30 dB. This is predominantly due to the coupling loss between the output port 102 of the RTF module 100 and the input to its primary receiver 207. However, the system would still be sensitive enough to detect the presence of signals stronger than −60 dBm.

It is to be understood that the above embodiments have been provided only by way of exemplification of this invention, and that further modifications and improvements thereto, as would be apparent to persons skilled in the relevant art, are deemed to fall within the broad scope and ambit of the present invention described herein.

The invention claimed is:

1. A test module for use in a system for locating faults, said test module including:
   an input port for receiving one or more test signals;
   an output port for applying said one or more test signals to a test medium;
   a monitor port for reception of a plurality of passive intermodulation signals produced by the test medium in response to the test signals;
   a directional coupler module coupled between the input and output ports;
   a primary receiver coupled to the directional coupler module for reception of a plurality of primary return signals produced by the test medium in response to the one or more test signals;
   a reference receiver coupled to the directional coupler module for generating a plurality of reference signals from the one or more test signals;
   a phase detector module coupled to the primary and reference receivers, said phase detector measuring phase offsets between the plurality of primary return signals and reference signals;
   a control module coupled to the primary and reference receivers and the phase detector, said control module being adapted to:
      convert each signal within the plurality of primary return signals from the primary receiver to a set of primary power levels;
      convert each signal within the plurality of reference signals from the reference receiver to a set of reference power levels;
      convert each signal within the plurality of signals from the phase detector to a set of phase offsets in degrees; and
      store the converted power level for the primary return and reference signal levels and the converted set of phase offsets between the primary return and reference signals for further processing.

2. The test module of claim 1 wherein the directional coupler includes at least one forward coupler and at least two reverse couplers.

3. The test module of claim 2 wherein the at least one forward coupler has a coupling loss of 37 dB and the at least two reverse couplers have a coupling loss of 30 dB.

4. The test module of claim 2 wherein a directivity of the at least one forward coupler and the at least two reverse couplers is tuned to at least 20 dB across the test signal bands.

5. The test module of claim 1, further including a synthesizer module coupled to the directional coupler module.

6. The test module of claim 5 wherein the synthesizer module includes a VSWR source, a first frequency synthesizer and a second frequency synthesizer.

7. The test module of claim 6 wherein a wideband PLL synthesizer can be tuned to a range of frequencies within the test signal bands.

8. The test module of claim 7 wherein the VSWR source is tuned in increments of 5 kHz.

9. The test module of claim 6 wherein the VSWR source is programmable to a number of discrete power levels.

10. The test module of claim 9 wherein the VSWR source is set to at least one of a set of discrete power levels consisting of: −4 dBm, −1 dBm, +2 dBm, and +5 dBm.

11. The test module of claim 6 wherein the VSWR source is connected to an RF amplifier module for boosting the VSWR source to approximately +15 dBm.

12. The test module of claim 1 wherein the primary receiver includes a narrowband heterodyne receiver with a pair of RF switches at its front end.

13. The test module of claim 1 wherein the primary receiver includes a two-stage downconverter, with amplification and filtering in both first and second IF stages.

14. The test module of claim 13 wherein a second IF bandwidth of the primary receiver is 4 kHz and a nominal noise floor is better than −130 dBm.

15. The test module of claim 1 wherein the reference receiver includes a narrowband heterodyne receiver with a network of solid state switches and SAW filters at its front end.

16. The test module of claim 15 wherein the reference receiver includes a first downconverter, a bandpass filter and a second downconverter.

17. The test module of claim 1, further including a reflectometer coupled between the directional coupler module and the reference receiver for measurement of a vector reflection coefficient.

18. A system for locating faults, said system including:
   a test module, said test module having:
      an input port for receiving one or more test signals;
      an output port for applying said one or more test signals to a test medium;
      a monitor port for reception of a plurality of passive intermodulation signals produced by the test medium in response to the test signals;
      a directional coupler module coupled between the input and output ports;
      a primary receiver coupled to the directional coupler module for reception of a plurality of primary return signals produced by the test medium in response to the one or more test signals;
      a reference receiver coupled to the directional coupler module for generating a plurality of reference signals from the one or more test signals;
      a phase detector module coupled to the primary and reference receivers, said phase detector measuring phase offset between corresponding pairs of primary and reference return signals for each pair of signals within the plurality of primary return signals and the plurality of reference return signals to produce a set of phase offsets;
      a control module coupled to the primary and reference receivers and the phase detector, said control module being adapted to:
         convert each signal within the plurality of primary return signals from the primary receiver to a set of primary power levels;
         convert each signal within the plurality of reference signals from reference receiver to a set of reference power levels;
         convert each signal within the plurality of signals from the phase detector to a set of phase offsets in degrees; and
         store the converted power level for the primary return and reference signal levels and the converted set of phase offsets between the primary and reference signals for further processing;

a test unit coupled to the input port of the test module, said test unit providing said one or more test signals and wherein the test unit is adapted to:
- receive from the control module the converted power levels for the primary return and reference signals and the converted set of phase offsets between the primary return and reference signals and combine them into a single vector;
- estimate from the single vector the number of passive intermodulation sources within the test medium;
- determine for each passive intermodulation source its magnitude and location within the test medium; and
- display the magnitude and location of each passive intermodulation source within the test medium.

19. The system of claim 18 wherein the directional coupler includes at least one forward coupler and at least two reverse couplers.

20. The system of claim 19 wherein the at least one forward coupler has a coupling loss of 37 dB and the at least two reverse couplers have a coupling loss of 30 dB.

21. The system of claim 19 wherein a directivity of the at least one forward coupler and the at least two reverse couplers is tuned to at least 20 dB across the test signal bands.

22. The system of claim 18 wherein the test module further includes a synthesizer module coupled to the directional coupler module.

23. The system of claim 22 wherein the synthesizer module includes a VSWR source, a first frequency synthesizer and a second frequency synthesizer.

24. The system of claim 23 wherein a wideband PLL synthesizer can be tuned to a range of frequencies within the test signal bands.

25. The system of claim 24 wherein the VSWR source is tuned in increments of 5 kHz.

26. The system of claim 23 wherein the VSWR source is programmable to a number of discrete power levels.

27. The system of claim 26 wherein the VSWR source is set to at least one of a set of discrete power levels consisting of: −4 dBm, −1 dBm, +2 dBm, and +5 dBm.

28. The system of claim 23 wherein the VSWR source is connected to an RF amplifier module for boosting the VSWR source to approximately +15 dBm.

29. The system of claim 18 wherein the primary receiver includes a narrowband heterodyne receiver with a pair of RF switches at its front end.

30. The system of claim 18 wherein the primary receiver includes a two-stage downconverter, with amplification and filtering in both first and second IF stages.

31. The system of claim 30 wherein the second IF bandwidth of the primary receiver is 4 kHz and the nominal noise floor is better than −130 dBm.

32. The system of claim 18 wherein the reference receiver includes a narrowband heterodyne receiver with a network of solid state switches and SAW filters at its front end.

33. The system of claim 32 wherein the reference receiver includes a first downconverter, a bandpass filter and a second downconverter.

34. The system of claim 18 wherein the test module further includes a reflectometer coupled between the directional coupler module and the reference receiver for measurement of a vector reflection coefficient.

35. The system of claim 18 wherein the estimation of the number of passive intermodulation source includes:
- constructing a system of linear prediction equations based on the single vector to produce a linear prediction data matrix;
- performing a singular value decomposition on the linear prediction data matrix to produce a set of singular values;
- analyzing the set of singular values to identify the points in the set for which a 6 dB decrease in magnitude occurs from one singular value to the next; and
- setting all singular values that are located after a last identified transition within the set of singular values to zero to produce a set of modified singular values.

36. The system of claim 35 wherein the calculation of the location and magnitude of each passive intermodulation source includes:
- reconstituting a modified linear prediction data matrix using the set of modified singular values;
- determining coefficients of a characteristic polynomial for the modified linear prediction data matrix utilizing a Total Least Squares method;
- calculating roots of the characteristic polynomial using said coefficients;
- calculating the location of each passive intermodulation source from said roots;
- calculating the magnitude of each passive intermodulation source via a Least Squares Prony method, using said coefficients and roots of the characteristic polynomial.

37. The system of claim 18 wherein the calculation of the location and magnitude of each passive intermodulation source includes:
- constructing a system of forward and backward linear prediction equations based on the single vector;
- determining coefficients of a characteristic polynomial for the system of forward and backward linear prediction equations;
- construct a linear prediction filter by calculating roots of the characteristic polynomial using said coefficients;
- extrapolate via the linear prediction filter the converted power level for the primary return and reference signal levels and the converted set of phase offsets between the primary return and reference signals to obtain an extrapolated data set; and
- compute an inverse Fast Fourier Transform of the extrapolated data set to obtain an enhance ranged profile depicting the location and magnitude of each passive intermodulation source.

38. The system of claim 37 wherein the calculation of the location and magnitude of each passive intermodulation source includes:
- determining the coefficients of the characteristic polynomial utilizing a Total Least Squares method.

39. The system of claim 37 wherein extrapolation via the linear prediction filter is performed autoregressively.

* * * * *